(12) United States Patent
Okubo et al.

(10) Patent No.: US 7,323,530 B2
(45) Date of Patent: Jan. 29, 2008

(54) TRANSPARENT RESIN FILM, ITS MANUFACTURING METHOD, ELECTRONIC DISPLAY, LIQUID CRYSTAL DISPLAY, ORGANIC EL DISPLAY, AND TOUCH PANEL

(75) Inventors: Yasushi Okubo, Hachioji (JP); Takahiro Takagi, Sagamihara (JP); Kaori Ono, Hino (JP)

(73) Assignee: Konica Minolta Holdings, Inc. (JP)

( * ) Notice: Subject to any disclaimer, the term of this patent is extended or adjusted under 35 U.S.C. 154(b) by 375 days.

(21) Appl. No.: 10/762,173

(22) Filed: Jan. 20, 2004

(65) Prior Publication Data

US 2004/0150331 A1 Aug. 5, 2004

(30) Foreign Application Priority Data

Jan. 27, 2003 (JP) .............................. 2003-017289

(51) Int. Cl.
*B32B 9/02* (2006.01)
(52) U.S. Cl. ..................... 528/26; 525/54.21; 525/389; 525/474; 528/42; 106/170.2; 106/287.13; 106/287.16

(58) Field of Classification Search ............. 525/54.21, 525/474, 389; 508/26, 42; 106/287.13, 106/287.15, 170.2, 287.16
See application file for complete search history.

(56) References Cited

U.S. PATENT DOCUMENTS

2002/0123209 A1* 9/2002 Yamada et al. ............. 438/432

FOREIGN PATENT DOCUMENTS

JP 2001277267 A * 10/2001

* cited by examiner

*Primary Examiner*—Irina S Zemel
(74) *Attorney, Agent, or Firm*—Cantor Colburn LLP

(57) ABSTRACT

A transparent resin film for an electronic display and its manufacturing method are disclosed, the transparent resin film having an ultraviolet light transmittance of not less than 50%, the ultraviolet light having a wavelength range of from 250 to 450 nm, and having a glass transition temperature of not less than 180° C., the glass transition temperature being measured according to thermal stress strain measurement (TMA).

8 Claims, 4 Drawing Sheets

TRANSPARENT RESIN FILM, ITS MANUFACTURING METHOD, ELECTRONIC DISPLAY, LIQUID CRYSTAL DISPLAY, ORGANIC EL DISPLAY, AND TOUCH PANEL

FIELD OF THE INVENTION

The present invention relates to a transparent resin film with a high ultraviolet light transmittance for an electronic display, a transparent conductive film employing the transparent resin film, and a manufacturing method thereof, and to a liquid crystal display, an organic EL display and a touch panel each employing the transparent conductive film.

BACKGROUND OF THE INVENTION

A glass plate has been used in view of high thermal stability, high transparency, or low moisture permeability, as a substrate for an electronic display such as a liquid crystal display, an organic electroluminescence display, a plasma display or an electronic paper or as a substrate of a photoelectronic device such as CCD or a CMOS sensor, or a solar battery. In recent years, as a cellular phone or portable information terminal units spread, use of a substrate which is flexible, light and difficult to be damaged, has been sought in place for a glass plate, which is relatively heavy and easy to be damaged.

Further, in a substrate for the electronic display element such as a liquid crystal display element, an organic electroluminescence display element, a plasma display, an electronic paper or touch panel or in a sealing material to protect the electronic display element from atmospheric air (moisture or oxygen) and elongate life of the electronic display element, use of a transparent film which is flexible, light and difficult to be damaged, has been sought in place for a glass plate, which is relatively heavy and easy to be damaged. Various studies of the transparent resin film have been made.

An inexpensive and versatile transparent resin film is disclosed. For example, an acrylate cross-linked resin is disclosed in Japanese Patent O.P.I. Publication No. 10-71667, a meleimide cross-linked resin in Japanese Patent O.P.I. Publication No. 5-209057, an α-methylstyrene cross-linked resin in Japanese Patent O.P.I. Publication No. 8-15682, a polycarbonate cross-linked resin in Japanese Patent O.P.I. Publication No. 2002-173529, and an epoxy cross-linked resin in Japanese Patent O.P.I. Publication No. 2001-59015. Further, polyethersulfone-polyacrylate plate laminate disclosed in Japanese Patent O.P.I. Publication No. 5-142525, polyethersulfone, or polycarbonate has been proposed, and some of them have been put into practical use.

In an electronic device such as a liquid crystal display, an organic EL display and a touch panel, an element of the electronic device is provided on a transparent film as a plastic substrate, and a transparent film as a sealing material is provided on the resulting material so as to protect the element from moisture or oxygen in atmosphere, the two films being adhered to each other through an adhesive.

As the adhesive, a UV curable resin is mainly used. A sealing material is superposed on a substrate, and the adhesive is applied between the substrate and the sealing material. Thereafter, the superposed material is subjected to actinic light (UV light) exposure from for example, the sealing material to cure the adhesive and form a sealed structure (sealing treatment).

Hitherto, a glass plate, having a good moisture resistance, has been mainly used as the substrate of the electronic display element or the sealing material. The glass plate has no problem during sealing treatment.

When a transparent resin film is used in place for the glass plate, it has been found that a PET film, a PEN film, or the polyethersulfone film described above has problem in sealing treatment in which curing of a UV curable resin constituting an adhesive does not sufficiently proceed on UV exposure, and has further problem in that thermal shrinkage or thermal deterioration occurs due to heat radiation to the film from a light source and due to heat generation of the film itself by UV absorption. The norbornene film, although there is no problem of curing of a UV curable resin, is made brittle upon UV exposure.

As is described above, a glass plate as the substrate or the sealing material cannot be simply substituted with any transparent resin film.

Further, it is necessary for a transparent resin film used for the electronic display to have characteristics such as an optical property, for example, birefringence and a gas barrier property. A transparent resin film having all of these necessary characteristics is not known.

SUMMARY OF THE INVENTION

An object of the invention is to provide a transparent resin film suitable for the substrate of an electronic display or a sealing material, a transparent conductive film employing the transparent resin film and a manufacturing method thereof. Another object of the invention is to provide a liquid crystal display, an organic EL display and a touch panel employing the transparent conductive film.

DETAILED DESCRIPTION OF THE INVENTION

Figure 1:
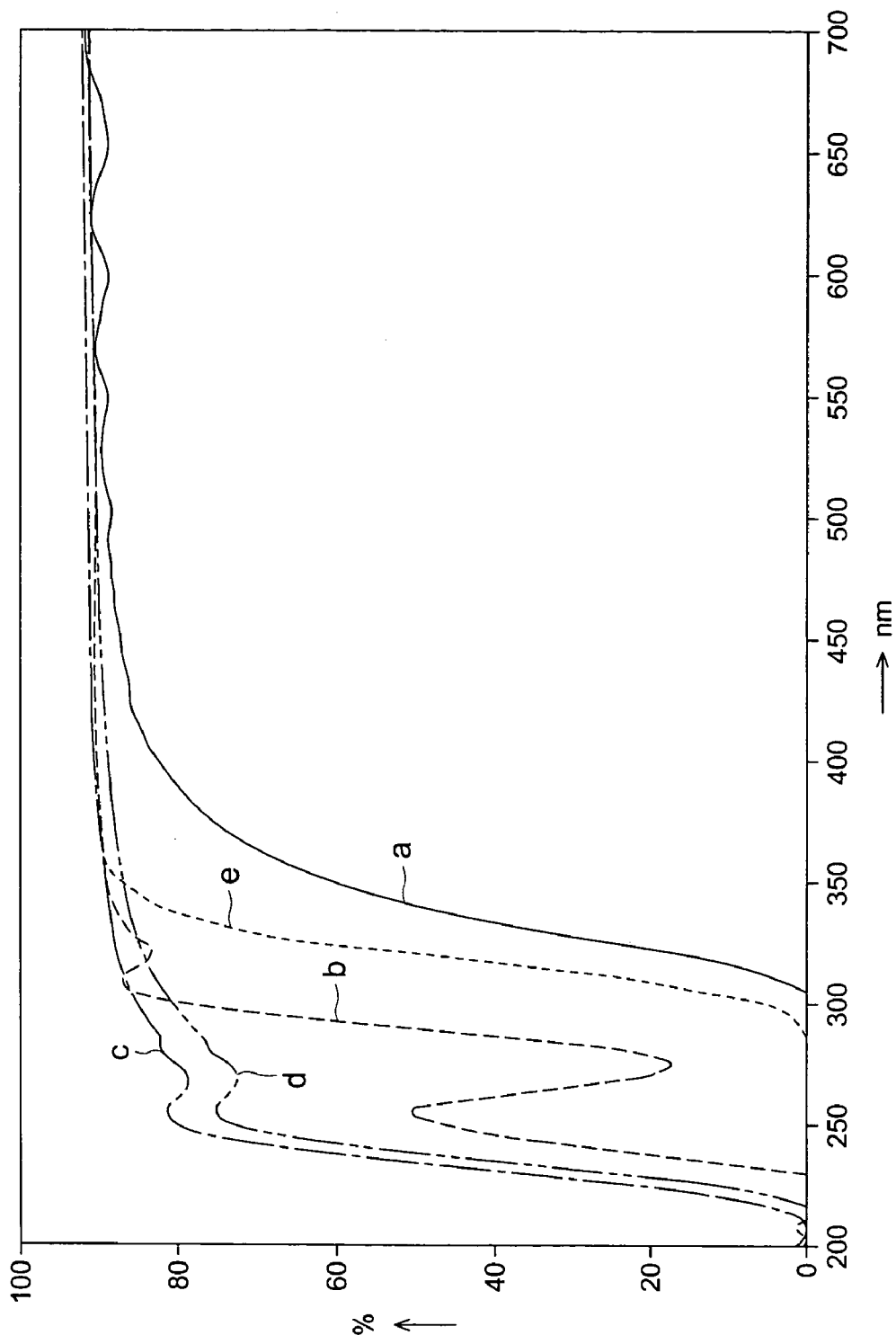
FIG. 1 is a diagram showing UV light transmittances of typical transparent films.

The above object of the invention can be attained by the following constitution:

1. A transparent resin film for an electronic display, wherein the transparent resin film has an ultraviolet light transmittance of not less than 50%, the ultraviolet light having a wavelength range of from 250 to 450 nm, and has a glass transition temperature of not less than 180° C., the glass transition temperature being measured according to thermal stress strain measurement (TMA).

2. The transparent resin film of item 1 above, wherein the transparent film contains a cellulose ester as a main component.

3. The transparent resin film of item 1 above, wherein the transparent film contains a cellulose ester and a hydrolytic polycondensation product of an alkoxysilane represented by the following formula 1, $$(R_{4-n})Si(OR')_n \qquad \text{Formula 1}$$

wherein R and R' independently represent a hydrogen atom or a substituent; and n represents an integer of 3 or 4.

4. The transparent resin film of item 2 above, wherein a degree of substitution in the cellulose ester satisfies the following expressions 1 and 2:

$$0 \leq Y \leq 1.5 \qquad \text{Expression 1}$$

$$1.0 < Y \leq 2.9 \qquad \text{Expression 2}$$

wherein X represents a degree of substitution of an acetyl group, and Y represents a degree of substitution of a substituent having an alkoxysilyl group.

5. The transparent resin film of item 3 above, wherein the content of the hydrolytic polycondensation product is less than 20% by weight based on the transparent film, and wherein the hydrolytic polycondensation product is represented by the following formula 2, $$(R_{4-n})SiO_{n/2} \qquad \text{Formula 2}$$

wherein R represents a hydrogen atom or a substituent; and n represents an integer of 3 or 4.

6. The transparent resin film of item 1 above, wherein the transparent film contains a plasticizer in an amount of less than 1% by weight.

7. The transparent resin film of item 1 above, wherein the ratio $R_0$ (480)/R (590) obtained by dividing retardation in plane $R_0$ (480) of the film at a wavelength 480 nm by retardation in plane R (590) of the film at a wavelength 590 nm is from 0.8 to less than 1.0.

8. The transparent resin film of item 3 above, wherein the transparent film contains the cellulose ester in an amount of not less than 80% by weight and the hydrolytic polycondensation product in an amount of 1 to less than 20% by weight in terms of silicon dioxide.

9. A transparent conductive film comprising the transparent resin film of item 1 above, wherein a moisture proof layer containing a metal oxide, a metal nitride or a metal carbide is provided on one side of the transparent resin film and a transparent conductive layer is provided on the moisture proof layer or on the other side of the transparent resin film.

10. The transparent conductive film of item 9 above, wherein the transparent conductive layer is provided on the moisture proof layer and on the other side of the transparent resin film.

11. The transparent conductive film of item 9 above, wherein the moisture proof layer is comprised mainly of silicon oxide.

12. The transparent conductive film of item 10 above, wherein the moisture proof layer is comprised mainly of silicon oxide.

13. The transparent conductive film of item 9 above, wherein the moisture proof layer is amorphous.

14. The transparent conductive film of item 9 above, wherein the moisture proof layer or the transparent conductive layer is formed by inducing electric discharge between two opposed electrodes at atmospheric pressure or at approximately atmospheric pressure by applying high frequency voltage across the two opposed electrodes to excite a reactive gas between the two opposed electrodes to a plasma state, and the exposing the transparent resin film to the reactive gas of the plasma state.

15. The transparent conductive film of item 14 above, wherein a frequency of the high frequency voltage is from 100 kHz to 150 MHz, and an output power supplied is from 1 to 50 W/cm².

16. A liquid crystal display comprising, as a substrate, the transparent conductive film of item 9 above.

17. An organic EL display comprising, as a substrate, the transparent conductive film of item 9 above.

18. A touch panel comprising, as a substrate, the transparent conductive film of item 9 above.

19. A method of manufacturing the transparent resin film of item 1 above according to a solution cast method.

1-1. A film for an electronic display comprising a transparent film, wherein the transparent film has an ultraviolet light transmittance of not less than 50%, the ultraviolet light having a wavelength range of from 250 to 450 nm, and has a glass transition temperature of not less than 180° C., the glass transition temperature being measured according to thermal stress strain measurement (TMA).

1-2. The film of item 1-1 above, wherein the transparent film contains cellulose ester as a main component.

1-3. A transparent film containing, as a main component, cellulose ester and a polycondensation product of an alkoxysilane represented by formula 1 above.

1-4. The transparent film of item 1-3 above, wherein a degree of substitution in the cellulose ester satisfies the expressions 1 and 2 above.

1-5. The transparent film of item 1-3 or 1-4 above, wherein when the hydrolytic polycondensation product of the alkoxysilane represented by formula 1 above is represented by the formula 2 above, the transparent film contains the inorganic compound represented by formula 2 in an amount of less than 20% by weight based on the weight of the transparent film.

1-6. The transparent film of any one of items 1-3 through 1-5 above, wherein the ratio $R_0$ (480)/R (590) obtained by dividing retardation in plane $R_0$ (480) of the film at a wavelength 480 nm by retardation in plane R (590) of the film at a wavelength 590 nm is from 0.8 to less than 1.0.

1-7. A film for an electronic display comprising the transparent film of any one of items 1-3 through 1-5 above.

1-8. A transparent conductive film, wherein a moisture proof layer containing a metal oxide or a metal nitride is provided on one side of the transparent film of any one of items 1-3 through 1-6, and a transparent conductive layer is provided on the moisture proof layer and/or on the other side of the transparent film.

1-9. A transparent conductive film, wherein a moisture proof layer containing a metal oxide or a metal nitride is provided on one side of the film for an electronic display of any one of item 1-1, 1-2 or 1-7 above, and a transparent conductive layer is provided on the moisture proof layer and/or on the other side of the film.

1-10. The transparent conductive film of item 1-8 or 1-9 above, wherein the moisture proof layer is comprised mainly of silicon oxide.

1-11. The transparent conductive film of item 1-8 or 1-9 above, wherein the moisture proof layer or the transparent conductive layer is formed by inducing electric discharge between two opposed electrodes at atmospheric pressure or at approximately atmospheric pressure by applying high frequency voltage across the two opposed electrodes, exciting a reactive gas between the two opposed electrodes to a plasma state, and exposing the transparent film to the reactive gas of the plasma state.

1-12. The transparent conductive film of item 1-11 above, wherein a frequency of the high frequency voltage applied is from 100 kHz to 150 MHz, and an output power supplied is from 1 to 50 W/cm$^2$.

1-13. A liquid crystal display comprising, as a substrate, the transparent conductive film of any one of items 1-8 through 1-11 above.

1-14. An organic EL display comprising, as a substrate, the transparent conductive film of any one of items 1-8 through 1-11 above.

1-15. A touch panel comprising, as a substrate, the transparent conductive film of any one of items 1-8 through 1-11 above.

1-16. A method of manufacturing the transparent film of any one of items 1-3 through 1-6 above according to a solution cast method.

The transparent resin film of the invention for an electronic display is used as a substrate of an electronic device such as a liquid crystal display, an organic EL display or a touch panel or as a sealing material for sealing the electronic device.

The transparent resin film of the invention has an ultraviolet light transmittance of not less than 50%, wherein the ultraviolet light has wavelength regions of from 250 to 450 nm.

FIG. 1 is a diagram showing UV light transmittances of a conventional transparent film, a glass plate, and the transparent resin film of the invention, in which the thickness of the glass plate and the films is 100 μm. In FIG. 1, "a" represents a UV light transmittance of a polyethersulfone (PES) film Sumilight FS1300 (produced by Sumitomo Bakelite Co., Ltd.), "b" that of a norbornene resin (PES) film Arton (R) (produced by JSR Co., Ltd.), "c" that of diacetylcellulose (DAC) film, "d" that of an organic-inorganic hybrid film comprised of cellulose ester and silica described later, and "e" that of a soda glass plate.

The polyethersulfone (PES) film has a low light transmittance in the UV wavelength regions. The soda glass plate, which is usually used as a substrate, has a low transmittance in the UV wavelength regions less than 300 nm, however, it is considered that since the glass plate (Tg>500° C.) has an extremely high heat resistance, even if it absorbs a 250 to 300 nm UV light, problem does not occur. The film Arton (R) has an absorption due to additives contained therein, and it has been confirmed that the film is made brittle by UV irradiation. In contrast, the transparent resin film of the invention, the DAC film and the organic-inorganic hybrid film have an ultraviolet light transmittance of not less than 50% over wavelength regions from 250 to 450 nm, and have an ultraviolet light transmittance of not less than 80% at most portions of the regions. It has been confirmed that these films do not produce problem that insufficient curing occurs during sealing treatment. Accordingly, it is essential in carrying sufficient curing during sealing treatment that a film have an ultraviolet light transmittance of not less than 50% at the wavelength regions from 250 to 450 nm. Higher ultraviolet light transmittance at the wavelength regions from 250 to 450 nm is considered to be advantageous during sealing treatment, provided that the ultraviolet light transmittance is not less than 50% at the wavelength regions from 250 to 450 nm. The upper limit of the UV light transmittance is not specifically limited, but since light is slightly reflected at the interface between the film and the atmospheric air, the upper limit is around 95%.

It is essential that the transparent resin film of the invention have a glass transition temperature of not less than 180° C. This is because when an ITO (indium tin oxide) transparent conductive layer, in which the ITO is required to be crystallized in order to obtain high electric conductivity, is formed on a transparent film, the crystallization temperature of ITO is considered to be around 180° C. ITO is crystallized at around 180° C., but a transparent film with higher heat resistance is preferred, since higher temperature gives a higher crystallization speed. Generally, a thermal expansion coefficient of an organic compound is higher by an order of magnitude than that of an inorganic compound. When a transparent ITO film, in which an ITO layer is provided on an organic film, is heated to high temperature, and then cooled to room temperature, cracks, ITO layer exfoliation, or film curl occur due to a great difference in the thermal expansion coefficient between the ITO layer and the organic film, and therefore, treatment at high temperature is not preferred. Accordingly, a film, which is resistant to 250° C., has a sufficient heat resistance as the transparent film.

Glass transition temperature of the cellulose ester in the invention is determined from an inflexion point of a temperature-strain curve obtained by a thermal stress strain measurement (TMA).

A linear expansion coefficient is determined through a thermal stress strain measurement instrument TMA-SS6100 produced by Seiko-Instruments Inc. A 4 mm wide film sample with a thickness of 100 μm is fixed at a distance of 20 mm between the chucks, and heated from room temperature to 180° C. to remove a residual strain. Thereafter, the sample is heated at a rate of 10° C./minute from room temperature to 250° C., and the linear expansion coefficient thereof is determined from elongation of the distance between the chucks. Further, the glass transition temperature of the sample is determined from an inflexion point of a temperature-strain curve obtained as described above.

Kinds of a resin material with a low UV light transmittance, constituting a film with a glass transition temperature of not less than 180° C. showing high heat resistance, are relatively few. Examples of such a resin material include cellulose ester resins such as diacetylcellulose (DAC) as described above. These cellulose ester resins are preferred since they have no aromatic group in the molecular skeleton.

Preferred examples of the cellulose ester include cellulose esters such as triacetyl cellulose (TAC), diacetyl cellulose (DAC), acetyl cellulose, cellulose acetate propionate (CAP), cellulose acetate butyrate (CAB), cellulose acetate phthalate, cellulose acetate trimellitate and cellulose nitrate. These cellulose esters have the UV light transmittance described above, and among these, ones having the heat resistance described above are selected and used in the invention. The thus selected cellulose esters are suitable for the transparent resin film of the electronic display of the invention. When the cellulose ester is used alone, diacetyl cellulose is especially preferred in view of heat resistance.

In order to provide a plasticizer effect, reduce moisture permeability, absorb a UV light with a wavelength less than 250 nm and infrared light, adjust a hue, a retardation, and a surface roughness, and improve an anti-oxidation property, the film may contain low molecular weight additives such as a plasticizer, a UV absorbing agent, an infrared absorbing agent, a dye, a retardation adjusting agent, a matting agent, and an antioxidant. However, it is necessary that the content of the additives in the film be controlled so as to satisfy the UV light absorption property described above and the UV light transmittance described above. When aromatic compounds, which have an absorption in the UV region, are used as additives of cellulose ester, it is necessary that the additives be contained in the film in an amount to give the ultraviolet light transmittance as described above.

Addition of these low molecular weight compounds tend to reduce a glass transition temperature of the film or increase a linear expansion coefficient, and the content of the compounds in the film is preferably less than 1% by weight, and it is more preferred that the compounds are not contained in the film. For example, when triacetylcellulose (TAC) contains 1% by weight of EPEG (ethylphthalylethyl glycolate) as a plasticizer, the glass transition temperature of the resulting triacetylcellulose is reduced by 10° C. Accordingly, the content of the low molecular weight compound in the film such as a plasticizer is preferably less than 1%.

The resins used in the transparent resin film of the invention include modified cellulose ester resins (or hybrid resins) modified with a polymer component which does not absorb UV light, and a hybrid resin. Such modified cellulose ester resins increases heat resistance, and have more preferred characteristics. It has been found that the transparent resin film of the invention has a low linear expansion coefficient. The electronic display shows a minute image, and it is preferred that the film have a low linear expansion coefficient.

The cellulose ester in the invention is preferably an organic-inorganic hybrid containing cellulose ester as a main component and a hydrolytic polycondensation product (hereinafter also referred to simply as the polycondensation product) of an alkoxysilane represented by the following formula 1:

$$R_{4-n}Si(OR')_n \qquad \text{Formula 1}$$

wherein R represents an alkyl group, R' represents a hydrogen atom or a monovalent substituent; and n represents 3 or 4.

The alkyl group represented by R' may have a substituent, and examples thereof include a methyl group, an ethyl group, a propyl group and a butyl group. The substituent is not specifically limited, and is, for example, a substituted alkyl group, for example, an alkyl group having a halogen atom or an alkoxy group, or an unsubstituted alkyl group. The unsubstituted alkyl group is preferred, and a methyl group or an ethyl group is especially preferred.

The monovalent substituent represented by R is nor specifically limited, and is for example, an alkyl group, a cycloalkyl group, an alkenyl group, an aryl group, an aromatic heterocyclic group or a silyl group, and preferably an alkyl group, a cycloalkyl group, or an alkenyl group. These groups may further have a substituent such as a halogen atom such as a fluorine atom or a chlorine atom, an amino group, an epoxy group, a mercapto group, a hydroxyl group or an acetoxy group, which does not jeopardize properties as an alkoxysilane.

Examples of the include silicon compounds such as tetramethoxysilane, tetraethoxysilane (TEOS), tetra-n-propoxysilane, tetraisopropoxysilane, tetra-n-butoxysilane, tetra-t-butoxysilane, tetrakis(methoxyethoxy)silane, tetrakis (methoxypropoxy)silane, tetrachlorosilane, tetraisocyanatosilane, methyltrimethoxysilane, methyltriethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, 3-glycidoxypropyltrimethoxysilane, 3-aminopropyltriethoxysilane, 2-(3,4-epoxycyclohexyl)ethyltrimethoxysilane, 3-chloropropyltrimethoxysilane, 3-mercaptopropyltrimethoxysilane, acetoxytriethoxysilane, (heptadecafluoro-1, 1,2,2-tetrahydrodecyl)trimethoxysilane, (3,3,3-trifluoropropyl)trimethoxysilane, (3,3,3-trifluoropropyl)triethoxysilane, pentafluorophenylpropyl-trimethoxysilane, vinyltrimethoxysilane, vinyltriethoxysilane, and phenyltrimethoxysilane.

The silicon compound may be a silicon compound in which several of each of the compounds above are condensed, for example, Silicate 40, Silicate 45, Silicate 48, or M Silicate 51, each produced by Tama Kagaku Co., Ltd.

The alkoxysilane described above has an alkoxide group, which bonds to a silicon atom, capable of being hydrolytically condensation-polymerized, and the hydrolytic polycondensation of the alkoxysilane forms a network structure in the polycondensation product. Further, the alkoxy silane or the polycondensation product is condensed with cellulose ester to form a cross-linked structure between the cellulose ester polymer chain and the polymer chain of the polycondensation product of the alkoxysilane. Thus, a transparent resin film comprised of a densely cross-linked cellulose ester is obtained. Since the silicon alkoxide or silica as the polycondensation product thereof, silica, has no absorption in the visible to UV regions (250 to 700 nm), the transparent resin film maintains high UV light transmittance of the cellulose ester itself, and increases heat resistance which shows the surprising effect that is difficult to deform under high temperature conditions. The transparent resin film containing the cellulose ester and the silica elevates a glass transition temperature of the film. The content of the silica in the transparent resin film is preferably less than 20% by weight, and more preferably from 1 to less than 20% by weight.

The main component referred to in the invention implies that the main component is contained in the transparent resin film in an amount of not less than 80% by weight based on the weight of the transparent resin film. In the invention, the main component is preferably cellulose ester. The rest other than the cellulose ester in the film is preferably a hydrolytic polycondensation product of the alkoxysilane represented by formula 1 above. Further, the total content of the cellulose ester and the polycondensation product in the transparent resin film is preferably not less than 99% by weight. Examples of material other than the cellulose ester and the polycondensation product, which may be contained in the transparent resin film, include a plasticizer and a matting agent described later.

The cellulose ester used in the transparent resin film of the invention is preferably acetylcellulose. The degree of substitution of the cellulose ester in the invention is preferably from more than 1.0 to 2.9. (A glucose unit constituting a cellulose molecule has three hydroxyl groups, which hydrogens can be substituted with another group. For example, when all the hydrogens of the three hydroxyl groups in cellulose are replaced with an acetyl group to form cellulose triacetate, the degree of the cellulose ester is 3.0.)

In the invention, the hydrogen of cellulose may be substituted with an alkoxysilyl group. The cellulose ester having the alkoxysilyl group can be prepared by hydrolytic condensation polymerization of alkoxysilane, and can form an organic-inorganic hybrid film with a network structure, which gives high mechanical strength.

The cellulose ester in the invention is more preferably a cellulose ester satisfying the following expressions 1 and 2:

$$0 \leq Y \leq 1.5 \qquad \text{Expression 1}$$

$$1.0 < Y \leq 2.9 \qquad \text{Expression 2}$$

wherein X represents a degree of substitution of an acetyl group, and Y represents a degree of substitution of a substituent having an alkoxysilyl group.

A cellulose ester satisfying the expression $1.0<X+Y\leq2.9$ has a high solubility and can provide a dope (a solution in which the resin is dissolved in a solvent) with high concentration, which is advantageous in film manufacture. The cellulose ester may have an alkoxysilyl group as a substituent which is capable of being condensed with an alkoxysilane polycondensation product. However, Y is preferably not more than 1.5, since too dense network structure provides a fragile film.

The glucose unit forming a cellulose ester has three free hydroxyl groups capable of being substituted. For example, when all hydrogens in the three hydroxyl groups of the glucose units in the acetyl cellulose ester are substituted with an acetyl group, the degree of substitution of an acetyl group is 3.0.

A degree of an acetyl group can be measured according to ASTM-D817-96.

Raw materials for the cellulose ester used in the invention are not specifically limited, and include cotton lint, tree pulp and kenaf. The cellulose derivatives derived from these raw materials may be used in combination in an arbitrary amount ratio. It is preferred that not less than 50% by weight of cotton lint are used as a raw material of the cellulose derivative.

The number average molecular weight (Mn) of the cellulose ester is preferably 70,000 to 200,000, in view of elasticity of the film, the dope viscosity or a film forming speed, more preferably 100,000 to 200,000. The cellulose ester used in the invention has a Mw/Mn ratio of preferably less than 3.0, and more preferably 1.4 to 2.3. Mw represents a weight average molecular weight.

The number average molecular weight or molecular weight distribution of cellulose ester can be determined employing high speed liquid chromatography. The number average molecular weight (Mn) and the weight average molecular weight (Mw) are measured employing high speed liquid chromatography, and the Mw/Mn ratio is determined.

The measurement conditions are shown hereunder.
Solvent: methylene chloride
Column: Three columns of Shodex K806, K805, and K803G (manufactured by Showa Denko Co., Ltd.) were employed in series.
Column temperature: 25° C.
Sample concentration: 0.1% by weight
Detector: RI Model 504 (manufactured by GL Science Co., Ltd.) Pump: L6000 (manufactured by Hitachi, Ltd.)
Flow rate: 1.0 ml/minute
Calibration curve: Standard Polystyrene STK standard polystyrenes (manufactured by TOSOH Corp., a calibration curve was drawn employing 13 kinds of polystyrenes having a molecular weight of from 1,000,000 to 500. Herein, 13 kinds of polystyrenes having a molecular weight divided equally among 13 are preferably used.

The degree of acyl substitution of cellulose ester is from 2.3 to 2.9, and preferably from 2.6 to 2.9. The degree of acyl substitution of cellulose ester is determined according to ASTM-D817-96.

The cellulose derivative content of the organic-inorganic hybrid film is preferably from 50 to 98.9% by weight, more preferably from 70 to 98.5% by weight, and still more preferably from 80 to 90% by weight.

The content of the polycondensation product in the transparent resin film is preferably from 1 to less than 20% by weight based on the weight of the film, in terms of the product represented by formula 2 above obtained by completing hydrolytic polycondensation of the alkoxysilane. The hydrolytic polycondensation reaction of the alkoxysilane represented by formula 1, $R_{4-n}Si(OR')_n$ above proceeds as shown in formula 3 below.

$$R_{4-n}Si(OR')_n + n/2 H_2O \rightarrow R_{4-n}SiO_{n/2} \qquad \text{Formula 3}$$

For example, tetraethoxysilane (Si (OEt)$_4$, molecular weight 208) is hydrolytically condensation polymerized in the presence of 2 equimolecular water to produce silica (SiO2, molecular weight 60), as a unit of the hydrolytic polycondensation product, and 100 parts by weight of tetraethoxysilane is hydrolyzed to theoretically produce 29 parts by weight of silica. Therefore, 171 parts by weight of triacetylcellulose (TAC) and 100 parts by weight of tetraethoxysilane provide an organic-inorganic hybrid film in which the silica content is 14.5% by weight.

<Hydrolysis Catalyst>

On preparing the transparent resin film of the invention, the alkoxysilane represented by formula 1 above may be condensed in the presence of water and a catalyst in order to accelerate its hydrolysis and promote condensation reaction.

However, water is preferably added to a dope for preparing the film in an amount of from 0.01 to 2.0% by weight based on the dope weight, in view of haze or flatness of film, and productivity such as film manufacturing speed or solvent recycling. When water is added to the hydrophobic alkoxysilane, a hydrophilic organic solvent such as methanol, ethanol or acetonitrile is preferably added so that water is miscible with the hydrophobic alkoxysilane. When the alkoxysilane or its hydrolytic polycondensation product is added to a cellulose ester dope, a good solvent for the cellulose ester is preferably added to the dope so that the cellulose ester does not sediment in the dope. The dope can be prepared by diluting a solution containing a hydrolysis polycondensation product of the alkoxysilane with a good solvent of cellulose ester, and adding cellulose ester thereto.

Examples of the catalyst for accelerating hydrolysis of the metal compound include an inorganic acid such as hydrochloric acid, sulfuric acid, nitric acid, 12 tungsto (VI) phosphoric acid, or 12 molybudo (VI) phosphoric acid, or silicon tungstic acid, and an organic acid such as acetic acid, trifluoroacetic acid, levulinic acid, citric acid, p-toluene sulfonic acid, or methane sulfonic acid. After the sol-gel reaction is completed in the presence of an acid catalyst, the resulting reaction mixture may be neutralized with a base. When the reaction mixture is neutralized with a base, the alkali metal content of the resulting mixture is preferably zero to less than 5000 ppm by weight based on the total solid content of the mixture. The catalyst may be used together with lewis acid such as a salt of acetic acid, with a metal such germanium, titanium, aluminum, antimony or tin, or another organic acid salt, a halide, a phosphate, an acetylacetone complex, or an acetoacetic acid complex.

As the catalyst, bases can be used instead of the acid catalysts. Examples of the bases include amines, for example, ammonia, monoethanolamine, diethanolamine, triethanolamine, diethylamine, triethylamine, aniline, N,N-dimethylaniline, etc.; five-member heterocyclic compounds, for example, imidazole, or pyrazole, etc.; six-member heterocyclic compounds, for example, pyridine, or pyrazine; etc., bicyclic amines, for example, DBU (diazabicycloundecene-1), DBN (diazabicyclononene), etc.; ammonia; phosphine; an alkali metal alkoxide; ammonium hydroxide; tetramethylammonium hydroxide; and benzyltrimethylammonium hydroxide.

The addition amount of these acid or base catalyst is not specifically limited, but is preferably from 0.01 to 20% by weight based on the weight of the reactive metal compound capable of being condensation-polymerized. Further, processing by the acids or bases can be repeated plural times. The catalyst after hydrolysis can be neutralized, removed under reduced pressure if they are volatile, or removed by washing with water. A solid catalyst such as ion-exchange resins, which easily removes the used catalyst, may be used.

Hydrolytic condensation polymerization of the alkoxysilane may be carried out in a solution (dope) containing the alkoxysilane before coating or in a web formed on a support after casting the solution on the support, however, the condensation polymerization reaction is preferably in equilibrium before coating. The condensation polymerization reaction need not be completed depending on usage.

<Additives>

The transparent resin film of the invention may contain a plasticizer giving processability, flexibility or moisture proof to the film, an anti-oxidizing agent preventing deterioration of the film, particles (matting agents) giving slidability to the film, or a retardation adjusting agent adjusting retardation of the film, as is disclosed in Japanese Patent O.P.I. Publication No. 2002-62430. It is preferred that the plasticizer is not contained in the resin film, since it lowers a glass transition temperature of the film. A UV absorbing agent may be contained in the resin film, however, since the film is required to have a transmittance of light with the UV wavelength regions described above of not less than 50%, it is preferred that a UV absorbing agent absorbing light with a wavelength of not less than 250 nm is not contained in the film.

<Solvent>

It is preferred that the cellulose silica hybrid film comprising cellulose ester and the alkoxysilane polycondensation product, which is one of the transparent resin film of the invention, is manufactured according to a solution casting method. The method comprises the step of dissolving cellulose ester such as acetylcellulose and the alkoxysilane or the alkoxysilane polycondensation product in a solvent to obtain a dope, casting the dope on a support, and evaporating the solvent to form the hybrid film. The solvent is preferably volatile since the solvent is necessary to be evaporated after casting or extruding the dope on a support to form a film on the support. Further, the solvent is preferably a solvent, which does not react with the metal compound or catalyst used and which does not dissolve a support on which a dope containing the solvent is cast or extruded. The solvent may be used as a mixture of two or more kinds thereof. The cellulose ester and the alkoxysilane described above may be dissolved in a different solvent, separately, and then the resulting solutions may be mixed.

In the invention, an organic solvent capable of dissolving the cellulose ester described above is referred to as a good solvent, and an organic solvent used in a large amount to dissolve the cellulose derivative is referred to as a main organic solvent.

Examples of the good solvent include ketones such as acetone, methyl ethyl ketone, cyclopentanone, and cyclohexanone; ethers such as tetrahydrofuran (THF), 1,4-dioxane, 1,3-dioxolane, and 1,2-dimethoxyethane; esters such as methyl formate, ethyl formate, methyl acetate, ethyl acetate, amyl acetate, and γ-butyrolactone; methylcellosolve; dimethylimidazolinone; dimethylformamide; dimethylacetoamide; acetonitrile; dimethylsulfoxide; sulfolane; nitroethane; and methylene chloride. 1,3-dioxolane, THF, acetone, methyl ethyl ketone, methyl acetate, and methyl acetoacetate are preferred.

The dope used in the invention preferably contains an alcohol having 1 to 4 carbon atoms in an amount of not less than 1 to 40% by weight, in addition to the solvents described above. When a dope employing such an alcohol is cast on a metal support, and the solvent is evaporated to form a web (referred to a dope film formed on a support after the dope is cast on the support), the residual alcohol content of the web increases during solvent evaporation, and the residual alcohol as a gelling agent results in gelation of the web, whereby the web formed are easily peeled from the support. An organic solvent containing such an alcohol in a small amount increases solubility of a cellulose derivative in an organic solvent containing no chlorine atom, and restrains gelation or separation of the reactive metal compound or viscosity increase of the dope.

The alcohols having 1 to 4 carbon atoms include methanol, ethanol, n-propanol, iso-propanol, n-butanol, sec-butanol, tert-butanol, and propylene glycol monomethyl ether. Of these alcohol solvents, alcohol is preferred, which is less harmful, provides good dope stability, and has a relatively low boiling point and good drying property. These alcohol solvents alone cannot dissolve the cellulose derivative and therefore belong to poor solvents.

Of the solvents satisfying the conditions described above and dissolving the cellulose ester as a preferred organic polymer, the preferred are a mixture solvent of methylene chloride and ethyl alcohol (having a methylene chloride to ethyl alcohol ratio of from 95:5 to 80:20), and a mixture solvent of methyl acetate and ethyl alcohol (having a methyl acetate to ethyl alcohol ratio of from 60:40 to 95:5).

In the invention, as a skeleton of a resin providing a positive wavelength diversion, there is, for example, cellulose ester. The cellulose ester has a hydroxyl group, and the substitution of the hydroxyl group with the alkoxysilane or its polycondensation product can provide an inexpensive transparent film having low birefringence, a positive wavelength dispersion of the birefringence and high heat resistance.

The positive wavelength dispersion of the birefringence herein referred to implies that a value obtained by dividing retardation in plane $R_0$ (480) of a film at a wavelength 480 nm by retardation in plane R (590) of the film at a wavelength 590 nm is less than 1. Herein, the film for measuring the retardation is one prepared by dissolving cellulose ester in a solvent to obtain a cellulose ester solution, casting the solution on a glass plate, and drying to obtain a thickness of 100 μm.

In the invention, the value $R_0$ (480)/R (590) obtained by dividing retardation in plane $R_0$ (480) of the transparent resin film of the invention at a wavelength 480 nm by retardation in plane R (590) of the transparent resin film of the invention at a wavelength 590 nm is preferably from 0.8 to less than 1.0.

The transparent film with a positive wavelength diversion of the birefringence can compensate polarization of light over the entire wavelength regions of visible light, can prevent color shift in a crystal liquid panel employing a displaying method employing birefringence, and can provide a good contrast image in an organic EL display element.

The transparent resin film of the invention may contain fine particles (a matting agent) providing slidability to the film or a retardation adjusting agent.

A moisture proof layer or a transparent conductive layer as described later is provided on the transparent resin film of the invention with a high UV light transmittance and is used as a substrate for an electronic display such as an organic EL element or a liquid crystal.

<Moisture Proof Layer>

The transparent resin film of the invention is used as a substrate for an electronic display. In order to protect the electronic display from moisture or oxygen in atmosphere, a moisture proof layer such as a layer of a metal oxide, a metal nitride, a metal nitride oxide or a metal carbide can be provided on at least one side of the substrate. The moisture proof layer may be plural, or may be provided on both sides of the substrate.

Examples of the metal oxide, metal nitride, metal nitride oxide or metal carbide described above include an oxide, nitride, nitride oxide or carbide of at least one metal selected from the group consisting of silicon, zirconium, titanium, tungsten, tantalum, aluminum, zinc, indium, chromium, vanadium, tin and niobium. Silicon oxide, aluminum oxide or silicon nitride is preferred. As a moisture proof layer, a metal oxide layer containing as a main component silicon oxide is especially preferred, in which the content of the silicon oxide as the main component in the metal oxide layer is not less than 80% by weight.

An amorphous inorganic material layer formed on a flexible resin film is preferred since it is difficult to produce cracks and has a large linear expansion coefficient. Whether or not a layer formed on the film is amorphous can be judged from scattering from the crystal lattices according to XRD measurement. When a gas-barrier layer formed is contaminated with a component (carbon or nitrogen) other than the main component, the layer is difficult to crystallize and is likely to be amorphous, and the layer may be one with a slight contamination.

A layer of the metal oxide, metal nitride or metal carbide is formed according to a vacuum deposition method, a sputtering method, or an ion plating method, but preferably according to an atmospheric pressure plasma discharge treatment method described later. A PVD method such as the vacuum deposition method, the sputtering method, or the ion plating method is carried out under vacuum, and is low in productivity, and the atmospheric pressure plasma discharge treatment method provides a good adhesion between a resin film and a layer formed thereon.

As disclosed in J. Sol-Gel Sci. Tech., p. 141-146 (1998), the layer of the metal oxide, metal nitride or metal carbide has drawbacks that it is likely to produce cracks into which moisture vapor permeates. The cracks can be easily sealed by providing an appropriate coating material on such a layer, whereby moisture vapor permeability of the layer is reduced. When the inorganic layer described above, which is low in linear expansion coefficient and is difficult to be broken, is firmly formed on a transparent resin film, dimensional stability of the transparent resin film itself is increased, which is preferred.

<Transparent Conductive Layer)

Next, a transparent conductive layer will be explained.

In the invention, the transparent conductive layer is generally known as an industrial material, and is a transparent and conductive layer which does not substantially absorb 400 to 700 nm visible light. The transparent conductive layer is used as a transparent electrode of an organic EL display etc., since it has high transmittance of a free charge carrier carrying electric charge at the visible regions. In the invention, a thickness of the transparent conductive layer used in an organic EL display is preferably from 100 to 140 nm.

Examples of the transparent conductive layer in the invention include a layer of an oxide or a complex oxide, which is doped with a dopant, such as $SnO_2$, $In_2O_3$, ZnO, $SnO_2$:Sb, $SnO_2$:F, ZnO:Al, or $In_2O_3$:Sn.

Examples of the complex oxide layer include an ITO layer in which indium oxide is doped with tin, a FTO layer in which tin oxide is doped with fluorine, and an IZO layer comprised of amorphous $In_2O_3$—ZnO.

The transparent conductive layer can be formed according to a wet process such as a coating method or a dry process such as a sputtering method, a vacuum deposition method, or an ion plating method. In the invention, the transparent conductive layer is preferably formed on the transparent resin film of the invention according to an atmospheric pressure plasma treatment method described later.

<Atmospheric Pressure Plasma Treatment>

The atmospheric pressure plasma treatment refers to a process comprising the steps of inducing electric field between opposed electrodes at atmospheric pressure or at approximately atmospheric pressure, exciting a reactive gas to a plasma state, and exposing a substrate to the reactive gas of the plasma state to form a layer on the substrate.

Herein, approximately atmospheric pressure herein referred to implies a pressure of 20 kPa to 110 kPa. In order to obtain the effects as described in the invention, the pressure is preferably 93 kPa to 104 kPa.

An apparatus and a method will be explained below, which is used to form the moisture proof layer or the transparent conductive layer in the invention according to atmospheric pressure plasma treatment.

<Atmospheric Pressure Plasma Discharge Treatment Apparatus>

The atmospheric pressure plasma discharge treatment apparatus comprises a roll electrode to be grounded and plural fixed counter electrodes (voltage application electrodes) arranged to oppose the roll electrode. In the apparatus, electric discharge is induced between the opposed electrodes to excite a reaction gas containing inert gas and reactive gas to a plasma state, and exposing, to the reaction gas of the plasma state, a substrate transporting while winding around the roll electrode to form a layer such as a moisture proof layer or a conductive layer on the substrate.

There is another method in which the reaction gas of the plasma state is blown onto a substrate transporting near the electrodes (not between the electrodes) to form a layer.

Figure 2:
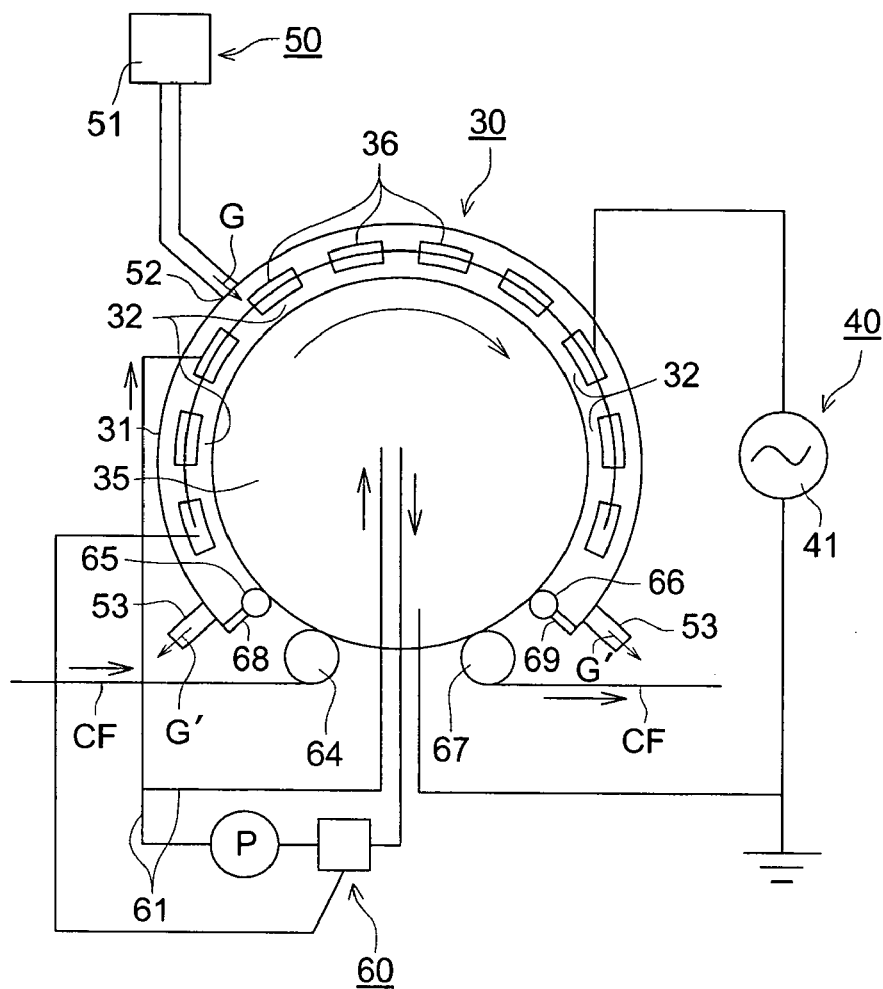
FIG. 2 is a diagram showing one embodiment of a plasma discharge treatment apparatus in which electric discharge is carried out at atmospheric pressure or approximately atmospheric pressure.

FIG. 2 is a diagram showing one embodiment of a plasma discharge treatment apparatus in which electric discharge is carried out at atmospheric pressure or approximately atmospheric pressure. FIG. 2 comprises a plasma discharge treatment apparatus 30, a gas supply means 50, a voltage application means 40, and an electrode temperature control means 60. A substrate CF is subjected to plasma treatment between a roll electrode 35 and a fixed prismatic electrode group 36. The substrate CF is conveyed from a preceding process or from a stock roll which is not illustrated, passed through guide roller 64 and through nip roller 65, which removes air accompanying the substrate, transported to a space between a group of the fixed prismatic electrodes 36 and the roll electrode 25, and further transported through nip roller 66 and guide roller 67 to the uptake roller, which is not illustrated, or to the next process. Gas G generated in gas generating device 51 is introduced from gas supply port 52 to a discharge space 32 of a plasma discharge vessel 31 by means of the gas supply means 50, the gas supply amount being controlled. Thus, the discharge space 32 and the plasma discharge vessel 31 are charged with the gas G. Waste gas G', which has been used for discharge treatment, is exhausted from exhaust port 53. Voltage is applied to the fixed prismatic electrode group 36 by means of a high frequency power supply 41 of the voltage application means 40, the roll electrode being grounded, whereby discharge plasma is generated at discharge space 32 between the opposed electrodes. A medium which is heated or cooled by a electrode temperature control means 60 is supplied through tube 61 to the roll electrode 35 and the fixed prismatic electrode group 36 employing a pump P.

It is preferred that temperature during the plasma treatment is properly controlled, since physical properties or composition of the formed layer vary due to the temperature of the substrate. Insulation materials such as distilled water and oil are preferably used for a temperature control medium. It is desired that the electrodes be controlled to have a uniform temperature during the plasma discharge treatment in order to minimize temperature unevenness in the width and longitudinal directions of the substrate. Numerical numbers 68 and 69 are partition plates for separating the plasma discharge vessel 31 from the exterior.

The reaction gas used for discharge plasma treatment is introduced from the gas supply port 52 to the plasma discharge vessel 31, and waste gas, which has been used for the treatment, is exhausted from exhaust port 53.

Figure 3:
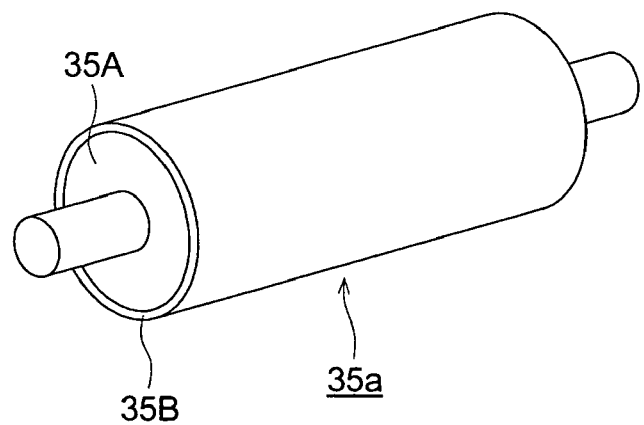
FIG. 3 is a schematic diagram showing a roll electrode comprising a conductive base material such as a metal and provided thereon, a dielectric layer.

FIG. 3 is a schematic diagram showing a roll electrode comprising a conductive base material such as a metal and provided thereon, a dielectric layer.

In FIG. 3, the roll electrode 35a is an electrode in which a conductive metal base material 35A is coated with a ceramic dielectric layer 35B, the coating being carried out by thermally spraying ceramic on the base roll to form a ceramic layer, and sealing the ceramic layer with sealing materials such as inorganic compounds. The thickness of the ceramic dielectric layer is about 1 mm. The roll electrode is grounded. The ceramic used for thermal spraying is preferably alumina, or silicon nitride, and more preferably alumina in view of easy processability.

The dielectric layer may be provided on a conductive base roll by lining of inorganic materials.

Examples of conductive metal base materials 35A include metals such as titanium, a titanium alloy, silver, platinum, stainless steel, aluminum, or iron, a composite of iron and ceramic, and a composite of aluminum and ceramic. Titanium or a titanium alloy is preferable in view of stability of the electrode.

The conductive base material and the electric will be detailed below.

Figure 4:
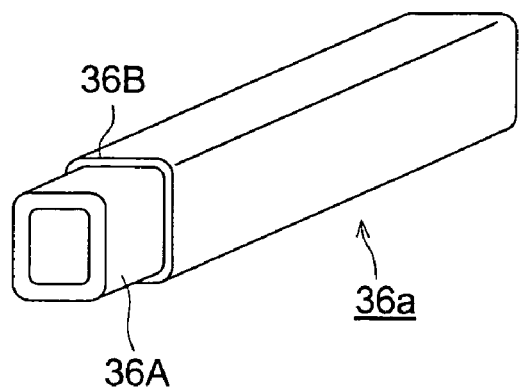
FIG. 4 is a schematic diagram showing one fixed electrode in the prismatic form comprising a base material and provided thereon, a dielectric layer.

FIG. 4 is a perspective view of one embodiment of one fixed electrode in the prismatic form comprising a base material and provided thereon, a dielectric layer.

In FIG. 4, prismatic electrode 36a is comprised of a conductive base material 36A such as a metal and a dielectric layer 36B coated thereon, as in FIG. 3. The prismatic electrode is of a metal pipe coated with the dielectric layer, and has a structure capable of being cooled with chilled water during discharge treatment. Fourteen fixed prismatic electrodes are provided along a circumference of a circle greater than the roll electrode circle.

The prismatic electrode 36a illustrated in FIG. 4 is preferably used in the invention, since it forms a broader discharge surface as compared with a cylindrical electrode.

The power source for applying voltage to the voltage application electrodes is not specifically limited. Examples thereof include a high frequency power source (3 kHz), a high frequency power source (5 kHz), a high frequency power source (15 kHz), or a high frequency power source (50 kHz), each produced by Shinko Denki Co., Ltd., a high frequency power source (100 kHz, continuous mode) produced by Heiden Kenkyusho, a high frequency power source (200 kHz) produced by Pearl Kogyo Co., Ltd., a high frequency power source (800 kHz) produced by Pearl Kogyo Co., Ltd., a high frequency power source (2 MHz) produced by Pearl Kogyo Co., Ltd., a high frequency power source (13.56 MHz) produced by Nippon Denshi Co., Ltd., a high frequency power source (27 MHz) produced by Pearl Kogyo Co., Ltd., and a high frequency power source (150 MHz) produced by Pearl Kogyo Co., Ltd. A power source supplying 433 MHz, 800 MHz, 1.3 GHz, 1.5 GHz, 1.9 GHz, 2.45 GHz, 5.2 GHz, or 10 GHz can be also used. Two or more high frequencies may be superimposed. At the superposition, a combination of a frequency of from 1 kHz to 1 MHz and a frequency of from 1 MHz to 2500 MHz is preferred.

The gap distance between the opposed electrodes is determined considering thickness of a dielectric layer provided on the electrode base, or an object of employing plasma. When one of the opposed electrodes described above has a dielectric layer or both opposed electrodes described above have a dielectric layer, the minimum gap distance between the electrode and the dielectric layer or between the both dielectric layers is preferably 0.5 to 20 mm, and more preferably 1±0.5 mm, in carrying out uniform discharge.

The level of voltage applied to the fixed electrode group 36 in the prismatic form by power source 41 is optionally determined. For example, the voltage is from 0.5 to 10 kV, and frequency of power source is adjusted to the range of from more than 100 kHz to 150 MHz. Herein, as a voltage application method, either a continuous oscillation mode (called a continuous mode) with a continuous sine wave or a discontinuous oscillation mode (called a pulse mode) carrying ON/OFF discontinuously may be used, but the continuous mode is preferred in obtaining a uniform layer with high quality.

The vessel used in the plasma discharge vessel 31 is preferably a vessel of pyrex (R) glass or plastic, but a vessel of metal may be used if insulation from the electrodes is secured. For example, the vessel may be a vessel of aluminum or stainless steel laminated with a polyimide resin or a vessel of the metal which is thermally sprayed with ceramic to form an insulation layer on the surface.

In order to minimize an influence on a substrate during the discharge plasma treatment, the substrate temperature is preferably adjusted to a temperature of preferably from room temperature (15 to 25° C.) to 300° C. In order to adjust to the temperature within the range described above, the substrate or the electrodes are optionally cooled with a cooling means during the discharge plasma treatment.

<Reaction Gas>

A reaction gas used for forming a moisture proof layer of the transparent resin film of the invention will be explained below.

The reaction gas is basically a mixed gas of inactive gas and a reactive gas for forming a layer. The reactive gas content of the reaction gas is preferably 0.01 to 10% by volume based on the reactive gas. The thickness of the layer formed is from 0.1 to 1000 nm.

The reaction gas used is basically a mixed gas of inactive gas and a reactive gas for forming a layer.

The inactive gas herein referred to implies nitrogen or an element belonging to group XVIII in the periodic table, typically rare gas such as helium, neon, argon, krypton, xenon, or radon. In order to obtain the effects of the invention, helium, argon or nitrogen is preferably used. In order to obtain a layer with high density and high accuracy, argon is preferably used as rare gas. Use of argon is considered to easily generate plasma with a high density. The argon content of the reaction gas (mixed gas of rare gas and a reactive gas) is preferably from 90.0 to 99.9% by volume based on the 100% by volume of the reaction gas.

The reaction gas used for forming a layer is basically a mixed gas of a reactive gas for forming the layer and inactive gas. The reactive gas is contained in the reaction gas in an amount of preferably 0.01 to 10% by volume based on the reactive gas. The thickness of the layer formed is from 0.1 to 1000 nm.

A reactive gas contains a component which is excited to plasma state to form a layer, and as the reactive gas, there is an organometallic compound, an organic compound, or an inorganic compound, which contributes to layer formation, or a hydrogen gas, an oxygen gas or a carbon dioxide gas, which is used as an auxiliary agent further containing a component selected from oxygen, ozone, hydrogen peroxide, carbon dioxide, carbon monoxide, hydrogen and nitrogen in an amount of 0.01 to 5% by volume can accelerate reaction, and can form a layer with high density and high quality.

<Reactive Gas for Forming Moisture Proof Layer>

The reactive gas for forming moisture proof layer may be any as long as it can form a moisture proof layer. Preferred examples thereof include a titanium compound, a tin compound, a silicon compound, a fluorine-containing silicon compound or a mixture thereof, and a silicon compound is most preferred.

Examples of the silicon compound used for forming a moisture proof layer include a silicon compound such as an organosilicon compound, a silicon hydride compound or a silicon halide compound. Examples of the organosilicon compound include tetraethylsilane, tetramethylsilane, tetraisopropylsilane, tetrabutylsilane, tetraethoxysilane, tetraisopropoxysilane, tetrabutoxysilane, dimethyldimethoxysilane, dimethyldiethoxysilane, diethyldiethoxysilane, diethylsilane diacetoacetonate, methyltrimethoxysilane, methyltriethoxysilane, and ethyltriethoxysilane. Examples of the silicon hydride compound include momosilane and disilane. Examples of the silicon halide compound include tetrachlorosilane, methyltrichlorosilane, and diethyldiichlorosilane. These reactive gases can be singly or as a mixture of two or more kinds thereof.

Examples of the titanium compound used for forming a moisture proof layer include an organotitanium compound, a titanium hydride compound and a titanium halide compound. Examples of the organotitanium compound include triethyltitanium, trimethyltitanium, triisopropyltitanium, tributyltitanium, tetraethyltitanium, tetraisopropyltitanium, tetrabutyltitanium, triethoxytitanium, trimethoxytitanium, triisopropoxytitanium, tributoxytitanium, tetraethoxytitanium, tetraisopropoxytitanium, dimethyldimethoxytitanium, ethyltriethoxytitanium, methyltriisopropoxytitanium, tetradimethylaminotitanium, dimethyltitanium diacetoacetonate, and ethyltitanium triacetoacetonate. Examples of the titanium hydride compound include monotitanium hydride and dititanium hydride. Examples of the titanium halide compound include titanium trichloride, titanium tetrachloride.

Examples of the tin compound used for forming a moisture proof layer include an organotin compound, a tin hydride compound and a tin halide compound. Examples of the organotin compound include tetraethyltin, tetramethyltin, di-n-butyltin diacetate, tetrabutyltin, tetraoctyltin, tetraethoxytin, methyltriethoxytin, diethyldiethoxytin, triisopropylethoxytin, diethyltin, dimethyltin, diisopropyltin, dibutyltin, diethoxytin, dimethoxytin, diisopropoxytin, dibutoxytin, tin dibutyrate, ethyltin diacetoacetonate, ethoxytin diacetoacetonate, and dimethyltin diacetoacetonate. Examples of the tin halide compound include tin dichloride and tin tetrachloride. A layer formed employing such a tin compound is useful as an antistatic layer, since the specific resistance of the layer can be lowered to not more than $10^{11}$ $\Omega/cm^2$. The layer can be also used as an electrically conductive layer. These reactive gases can be used in combination of two or more kinds thereof.

Among the organosilicon compound, the organotitanium compound, and the organotin compound above, the metal hydride or metal alkoxide is preferably used in view of handling, and the metal alkoxide is more preferably used, since it is not corrosive, and generates no harmful gas nor causes contamination.

<Reactive Gas for Forming Transparent Conductive Layer>

The reactive gas for forming a transparent conductive layer is one, which is excited to plasma state in an electric discharge field, containing a component forming a transparent conductive layer. Examples thereof include an organometallic compound such as a β-diketone metal complex, a metal alkoxide, and an alkyl metal. As the reactive gas, there are a reactive gas forming a main component of the transparent conductive layer, a reactive gas used in a small amount for doping, and another reactive gas for adjusting electrical resistivity.

In the invention, the reactive gas for forming the main component of the transparent conductive layer is preferably an organometallic compound containing a metal in the molecule. Examples thereof include indium hexafluoropentanedionate, indium methyl(trimethyl)acetylacetate, indium acetylacetonate, indium isopropoxide, indium trifluoropentanedionate, tris(2,2,6,6-tetramethyl-3,5-heptanedionato)indium, di-n-butylbis(2,4-pentanedionato)tin, di-n-butyldiacetoxytin, di-t-butyldiacetoxytin, tetra-isopropoxytin, tetrabutopxytin, and zinc acetylacetonate. Among these, indium acetylacetonate, tris(2,2,6,6-tetramethyl-3,5-heptanedionato)indium, tris(2,6-dimethyl-3,5-heptanedionato)indium, zinc acetylacetonate, and di-n-butyldiacetoxytin are preferred.

Examples of the reactive gas for doping include isopropoxyaluminum, nickel acetylacetonate, manganese acetylacetonate, boron isopropoxide, n-butoxyantimony, tri-n-butylantimony, di-n-butylbis(2,4-pentanedionato)tin, di-n-butyldiacetoxytin, di-t-butyldiacetoxytin, tetraisopropxytin, tetrabutopxytin, tetrabutyltin, zinc acetylacetonate, hexafluoropropylene, octafluorocyclobutane, and carbon tetrafluoride.

Examples of the reactive gas used for adjusting an electrical resistivity include titanium isopropoxide, tetramethoxysilane, tetraethoxysilane, and hexametyldisiloxane.

The amount ratio of the reactive gas necessary to form the main component of the transparent conductive layer to the reactive gas used in a small amount for doping differs due to the kinds of the transparent conductive layer. For example, when an ITO layer comprised of indium oxide doped with tin is formed, it is necessary that the reactive gas used be adjusted so that an atomic ratio In/Sn of the ITO layer falls within the range of from 100/0.1 to 100/15. The ratio In/Sn of the ITO layer is preferably from 100/0.5 to 100/10. The atomic ratio, In/Sn is obtained by measurement according to XSP.

When a transparent conductive layer (hereinafter referred to as FTO layer) comprised of tin oxide doped with fluorine is formed, the reactive gas used is adjusted so that an atomic ratio Sn/F of the FTO layer falls within the range of from 100/0.01 to 100/50. The atomic ratio, Sn/F is obtained by measurement according to XSP.

When an $In_2O_3$—ZnO amorphous transparent conductive layer is formed, the reactive gas used is adjusted so that an atomic ratio In/Zn of the formed layer falls within the range of from 100/50 to 100/5. The atomic ratio, In/Zn is obtained by measurement according to XSP.

The doping amount in the above ITO, FTO, and IZO layers above is preferably not more than 5% by weight.

The content of the reactive in the reaction gas is preferably from 0.01 to 10%, and more preferably from 0.01 to 1% by volume, in that a uniform layer is formed on the substrate surface according to plasma discharge treatment.

The reaction gas further containing, as the reactive gas, a component selected from oxygen, ozone, hydrogen peroxide, carbon dioxide, carbon monoxide, hydrogen and nitrogen in an amount of 0.01 to 5% by volume can accelerate reaction, and can form a layer with high density and high quality. The thickness of the transparent conductive layer formed is from 0.1 to 1000 nm.

When the organotin compound, organotitanium compound, organosilicon compound or organotin compound above is introduced into a discharge space between the electrodes, the compound may be in the form of gas, liquid, or solid at ordinary temperature and ordinary pressure. When they are gas at ordinary temperature and ordinary pressure, they can be introduced in the discharge space as they are. When they are liquid or solid, they are gasified by heating, or under reduced pressure or ultrasonic wave radiation, and used. The above metal alkoxide may be diluted with another solvent. In this case, the diluted solution is gasified through a vaporizer and introduced into rare gas. The solvents include an organic solvent such as methanol, ethanol, n-hexane or a mixture thereof.

<Application Voltage>

In the layer formation in the invention, it is preferred that the formation comprises the steps of supplying power (output density) of not less than 1 $W/cm^2$ at a high frequency voltage exceeding 100 kHz across a gap between opposed electrodes, and exciting a reactive gas to generate plasma.

The upper limit of the frequency of the high frequency voltage applied across a gap between opposed electrodes is preferably not more than 150 MHz. The lower limit of the frequency of the high frequency voltage is preferably not less than 200 kHz, and more preferably not less than 800 kHz.

The lower limit of power supplied across a gap between opposed electrodes is preferably not less than 1.2 $W/cm^2$, and the upper limit of power supplied across a gap between opposed electrodes is preferably not more than 50 $W/cm^2$, and more preferably not more than 20 $W/cm^2$. The discharge surface area ($cm^2$) refers to the surface area of the electrode at which discharge occurs. When a high voltage is applied at a high frequency and at a high output density as in the invention, the discharge surface area corresponds to the total area of the discharge surface of electrode arranged on one side. The output density is obtained by dividing the total power supplied from a power source coupled to the electrodes with the total area above.

In the atmospheric pressure plasma discharge treatment, in order to form a layer with a uniform thickness over a large area, the total power supplied to a set of opposed electrodes is preferably more than 15 kW, more preferably not less than 30 kW, and most preferably not less than 50 kW. The total power is preferably not more than 300 kW, in view of heat generation. The total power herein referred to corresponds to power supplied from a power source coupled to the set of the opposed electrodes. When two or more power sources are coupled to the electrode set above, the total power is the sum of power supplied from each of the power sources. For example, in the plasma discharge apparatus in FIG. 2 described above, the total power is a power supplied from power source 41 which is coupled to a set of opposed electrodes composed of roll electrode 35 and prismatic electrode group 36.

In order to satisfy the total power range in the invention, it is necessary that the discharge surface area is relatively large.

The high frequency voltage applied to the electrodes may be a continuous sine wave or a discontinuous pulsed wave. The continuous sine wave is preferred in securing the effects of the invention.

<Atmospheric Pressure Plasma Discharge Treatment Apparatus: Electrode>

It is necessary that an atmospheric pressure plasma discharge treatment apparatus be installed with electrodes with high durability which are capable of maintaining uniform discharge even when such a high electric field is applied to a large surface area of the electrodes at atmospheric pressure or at approximately atmospheric pressure.

Such electrodes are preferably those in which a dielectric is coated on at least the discharge surface of the surfaces of conductive base materials such as metals. A dielectric is coated on at least one of a voltage application electrode and a grounding electrode opposed to each other, and preferably on both electrodes.

The dielectric coated electrode is a composite material comprised of conductive base material such as metals and a dielectric such as ceramic or glass. When supplied power, particularly total supplied power, is high, the dielectric coated electrode is likely to be damaged at weak portions of the dielectric coat, making it difficult to maintain stable plasma discharge. This phenomenon is particularly marked in a dielectric coated electrode with a large discharge surface, and accordingly in order to carry out a layer forming method employing high power as in the invention, a dielectric coated electrode capable of resisting such a high power is required.

The dielectric used in the dielectric coated electrode of the invention is preferably an inorganic compound having a dielectric constant of from 6 to 45. Examples thereof include ceramic such as alumina or silicon nitride, and a glass lining material such as silicate glass or borate glass. Of these, a dielectric layer is coated on the electrode preferably by thermal spraying of ceramic or by glass-lining, and more preferably by thermal spraying of alumina.

Still another preferred embodiment of the dielectric coated electrodes of the invention capable of resisting high electric power is one having a heat resistant temperature of not less than 100° C., preferably not less than 120° C., and more preferably not less than 150° C. The heat resistant temperature herein refers to a highest temperature capable of carrying out normal discharge without causing dielectric breakdown. The above heat resistant temperature can be attained by employing a dielectric layer formed according to the thermal spray of ceramic as described above, by employing a dielectric layer comprised of two or more layers, which differ in foam content, formed according to the glass-lining as described above, or by properly selecting conductive base materials and dielectrics in which the difference in linear thermal expansion coefficient between the conductive base materials and dielectrics falls within the range as described below.

Still further another preferred embodiment of the dielectric coated electrodes of the invention is a combination of conductive base material and dielectrics in which the difference in linear thermal expansion coefficient between the conductive base material and dielectrics is not more than $10 \times 10^{-6}/°$ C. The difference in linear thermal expansion coefficient between the conductive base materials and dielectrics is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

A combination of a conductive base material and dielectric falling within the above linear thermal expansion coefficient range difference is that of a titanium alloy or a titanium metal each containing not less than 70% by weight of titanium as the conductive base material, and ceramic or glass lining as the dielectric.

The titanium content of the titanium alloy or titanium metal may be not less than 70% by weight, but is preferably not less than 80% by weight. As the titanium alloy or titanium metal in the invention, those generally used such as pure titanium for industrial use, corrosion resistant titanium, and high strength titanium. Examples of the titanium for industrial use include TIA, TIB, TIC and TID, each of which contains a minute amount of an iron atom, a carbon, atom, a nitrogen atom, an oxygen atom or a hydrogen atom and not less than 99% by weight of titanium. The corrosion titanium is preferably T15PB, which contains a minute amount of the atom described above or lead, and not less than 98% by weight of titanium. The titanium alloy is preferably T64, T325, T525 or TA3, each of which contains a minute amount of the atom described above except for lead, aluminum, vanadium or tin, and not less than 85% by weight of titanium. Coefficient of thermal expansion of the titanium alloy or titanium metal described above is almost a half of that of stainless steel, for example, AISI316. The titanium alloy or titanium metal, which is used as a metal base material, is well combined with a dielectric described later, where the dielectric layer is coated on the metal base material, which provides high heat resistance and high durability.

Still another preferred embodiment of the dielectric coated electrodes of the invention capable of resisting high power is a dielectric coated electrode in which the dielectric layer has a thickness of from 0.5 to 2 mm. The variation of the dielectric layer thickness is preferably not more than 5%, more preferably not more than 3%, and still more preferably not more than 1%.

In order to further reduce the void volume of the dielectric layer, it is preferred that a thermally sprayed layer such as the thermally sprayed ceramic layer is subjected to sealing treatment employing an inorganic compound. The inorganic compound is preferably a metal oxide, and more preferably one containing a silicon oxide (SiOx) as a main component.

The inorganic compound for sealing is preferably one being hardened through sol-gel reaction. When an inorganic compound for sealing is a compound containing a metal oxide as a main component, a metal alkoxide is coated on the ceramic spray layer as a sealing solution, and hardened through sol gel reaction. When the inorganic compound for sealing is a compound containing silica as a main component, an alkoxysilane is preferably used as a sealing solution.

In order to accelerate the sol gel reaction, energy treatment is preferably carried out. Examples of the energy treatment include heat hardening (hardening at not more than 200° C.) or UV irradiation. A sealing method, in which the alternate coating and hardening of diluted sealing solution are repeated several times, provides an electrode with improved inorganic property, with high density and without any deterioration.

When in the preparation of the dielectric coated electrode, a metal oxide solution as a sealing solution is coated on a thermally sprayed ceramic layer and subjected to sealing treatment in which hardening is carried out through sol gel reaction, the metal oxide content after hardening is preferably not less than 60 mol %. When an alkoxysilane is used as a metal alkoxide of a sealing solution, the content of SiOx (x: not more than 2) after hardening is preferably not less than 60 mol %. The content of SiOx (x: not more than 2) after hardening is measured analyzing the section of the dielectric layer through an XPS.

The dielectric layer surface of the dielectric coated electrode is surface finished by polishing treatment so as to obtain a surface roughness Rmax (according to JIS B 0601) of not more than 10 μm, which makes it possible to maintain the dielectric layer thickness or a gap between the electrodes constant, provide stable discharge, and provide an electrode with greatly increased durability, with high precision and without any strain or cracking due to thermal shrinkage difference or residual stress. It is preferred that at least the surface of the dielectric layer on the side contacting the substrate is surface finished by polishing.

<Actinic Ray Cured Resin Layer as an Anti-Glare Layer or a Clear Hard Coat Layer>

In the transparent resin film of the invention, the metal compound layer such as the moisture proof layer or a transparent conductive layer above may be provided directly or through another intermediate layer on the transparent film. Examples of another intermediate layer include an anti-glare layer or a clear hard coat layer.

The actinic ray cured resin layer such as an anti-glare layer or a clear hard coat layer is a resin layer formed by polymerizing a composition containing an polymerizable unsaturated monomer. The actinic ray curable resin layer herein referred to implies a layer containing, as a main component, a resin which has been irradiated by actinic rays such as UV light or electronic beam to be cured. Examples of the actinic ray curable resin include an ultraviolet (hereinafter referred to also as UV) curable resin or an electron beam curable resin. The actinic ray curable resin may be a resin which can be cured by actinic rays other than UV or electron beam. The UV curable resins include a UV curable acrylurethane resin, a UV curable polyesteracrylate resin, a UV curable epoxyacrylate resin, a UV curable polyolacrylate resin and a UV curable epoxy resin.

These UV curable resins themselves absorb only light with a wavelength of 250 nm or less, but in order to polymerize these resins, a photopolymerization initiator such as 1-hydroxycyclohexyl phenyl ketone is often added to the UV curable resins as a catalyst which can initiate photopolymerization by irradiation of UV light with a wavelength of from 250 to 400 nm. The addition of such an initiator is undesired, since it results in lowering a UV light transmittance of the transparent film. It is preferred that the photopolymerization initiator is not added. Since the acrylate UV light curable resins have an absorption in the wavelength regions of not more than 250 nm, an acrylate resin layer, having no absorption in the wavelength regions of from 250 to 400 nm, can be formed by polymerizing the acrylate resin by irradiation of UV light with wavelength regions of less than 250 nm (a 248 nm Kr—F excimer laser or a 193 nm Ar—F excimer laser), by employing a thermal polymerization initiator having no absorption in the wavelength regions of from 250 to 400 nm, or by initiating plasma polymerization exposing a coated acrylate layer to the plasma as described above.

The actinic ray cured resin layer such as an anti-glare layer or a clear hard coat layer may contain inorganic or organic fine particles. The inorganic fine particles include silicon oxide, titanium oxide, and aluminum oxide. The organic fine particles include polymethacrylic acid-methylacrylate resin particles. These particles have an average particle size of 0.01 to 10 μm. The content of the particles is preferably 0.1 to 20 parts by weight based on the 100 parts by weight of the UV cured resin layer.

<Layer Constitution>

The transparent resin film of the invention comprises a moisture proof layer and a transparent conductive layer on a substrate. These two layers may be provided on one side of the substrate. One may be provided on one side of the substrate and the other on the other side of the substrate. Further, the moisture proof layer may be provided on both sides of the substrate.

When one of the moisture proof layer and the transparent conductive layer is laminated with the other, continuous plasma discharge treatment is carried out, for example to form the moisture proof layer and then the transparent conductive layer in that order in two of the atmospheric pressure plasma discharge treatment apparatus as shown in FIG. 2 connected in series. This continuous treatment is preferred in the invention, since it provides high stability of quality, reduces cost of manufacture, and improves productivity. Serial treatment can be also carried out in which after a substrate has been treated to form one layer, and wound up, the substrate is unwound and treated to form the other layer.

An anti-stain layer may be provided on the rear surface of the transparent conductive film opposite on which the conductive layer is not provided. When the moisture proof layer is provided on the rear surface of the transparent conductive film, an anti-stain layer or an anti-reflection layer may be provided on the moisture proof layer. Another material in the film, sheet or plate form may be laminated on the transparent film or the transparent conductive film of the invention.

The anti-stain layer is a layer hardly receiving stain such as dust or fingerprint and easily removing stain, if received, which makes a transparent image through the transparent film clear. The anti-stain layer is formed, for example by dispersing a hest curable fluorine-containing polymer in isopropyl alcohol to obtain a 0.2% by weight fluorine-containing polymer dispersion, and then coating the resulting dispersion on the transparent film as an outermost layer through a bar coater.

The preferred constitution of the transparent conductive film of the invention will be shown below.
(A) Substrate/Moisture proof layer/Transparent conductive layer
(B) Anti-stain layer/Substrate/Moisture proof layer/Transparent conductive layer
(C) Moisture proof layer/Substrate/Transparent conductive layer
(D) Anti-stain layer/Moisture proof layer/Substrate/Moisture proof layer/Transparent conductive layer The transparent resin film of the invention, having a moisture proof layer and/or a transparent conductive layer, can be used as a substrate for an electronic display element such as a liquid crystal display element, an organic EL display element, a plasma display or an electronic paper or a protective layer for sealing.

For example, the transparent resin film of the invention is provided on the electronic display and a UV curable adhesive is provided between the film and the display. Thereafter, the resulting material is exposed to UV light from the film side to cure the adhesive, sealed and integrated.

Preferred examples of the UV curable resin for sealing the electronic display with the transparent resin film of the invention include a UV curable acrylurethane resin (see for example, Japanese Patent O.P.I. Publication No. 59-151110), a UV curable polyesteracrylate resin (see for example, Japanese Patent O.P.I. Publication No. 59-151112), a UV curable epoxyacrylate resin (see for example, Japanese Patent O.P.I. Publication No. 1-105738), a UV curable polyolacrylate resin such as trimethylolpropane triacrylate, ditrimethylolpropane tetracrylate, or pentaerythritol tetracrylate, a UV curable adhesive such as an acryl or methacryl oligomer containing a reactive vinyl group, and a cationic polymerization type UV curable epoxy resin. The cationic polymerization type UV curable epoxy resin is especially preferred in that it is not influenced by oxygen and polymerization proceeds after UV irradiation.

A UV curable epoxy prepolymer, which is polymerized by cationic polymerization, is one containing two or more epoxy groups in one molecule. Examples thereof include alicyclic polyepoxides, polyglycidylesters of polybasic acids, polyglycidylesters of polyhydric alcohols, polyglycidylesters of polyoxyalkylene glycols, hydrogenated polyglycidylesters of aromatic polyols, urethane polyepoxy compounds and epoxydated polybutadiene. These prepolymers may be used alone or as an admixture of two or more kinds thereof.

The cationic polymerization initiators are typically aromatic onium salts. The aromatic onium salts include phosphonium salts, sulfonium salts, iodonium salts. These are detailed in U.S. Pat. Nos. 4,058,401 and 4,069,055. Sulfonium salts of an element belonging to No. VI group in the periodic table, for example, triphenylsulfonium tetrafluoroborate, or triphenylsulfonium hexafluoroantimonate are preferable, and triarylsulfonium hexafluoroantimonate is more preferable in stability of a UV curable resin composition. The known initiators described in "Photopolymer Handbook", edited by Photopolymer Konwakai, published by Kogyo Chosakai, p. 39-56 (1989), or the initiators described in Japanese Patent O.P.I. Publication Nos. 64-13142 and 2-4804 may be also used.

As a light source for curing an actinic ray curable layer due to photo-curing reaction to form a cured layer, any light source capable of emitting UV rays can be used without limitations. Examples of the light source include a low pressure mercury lamp, a medium pressure mercury lamp, a high pressure mercury lamp, a super-high pressure mercury lamp, a carbon arc lamp, a metal halide lamp, and a xenon lamp. Although the exposure amount is varied depending on the kinds of light source, it may be 20-10,000 mJ/cm$^2$, and is preferably 50-2,000 mJ/cm$^2$. The sensitizer having an absorption maximum in the range of from near-ultraviolet to visible wavelength can be used.

When UV is irradiated through a conventional plastic plate or transparent film, light intensity in the UV regions is greatly lowered and long curing time is necessary. In contrast, when UV is irradiated through the transparent resin film of the invention, efficient photocuring is possible since the UV light transmittance of the transparent resin film of the invention is high.

The UV curable resin composition is provided on a substrate or a transparent film for sealing to form a UV curable resin layer, and UV is irradiated from the surface of the substrate or the film opposite the UV curable resin layer. The irradiation time is preferably from 0.1 seconds to 5 minutes, and more preferably from 0.1 to 10 seconds considering a balance between UV curability and work efficiency.

Some of the UV irradiation source generate heat, which may deteriorate the substrate, the transparent film for sealing, or the electronic display itself. Accordingly, the UV curable resin is preferably one which is capable of being cured at from room temperature to 80° C. The adhesive as described above may contain a desiccant. The adhesive can be coated on a substrate through a dispenser available on the market or printed on a substrate through a printing method such as screen printing.

EXAMPLES

Next, the present invention will be detailed employing examples, but is not specifically limited thereto.

Example 1

<Measurement of Degree of Substitution of Cellulose Ester>

A degree of substitution of cellulose ester was measured according to ASTM D817-96 as described below.

Cellulose ester of 1.90 g was dissolved in a solvent of 70 ml of acetone and 30 ml of dimethylsulfoxide while stirring, and 50 ml of acetone were added. Then, 30 ml of an aqueous 1 mol/liter sodium hydroxide solution was added to the resulting solution while stirring, saponified for 2 hours, and added with 100 ml of hot water to obtain a sample solution. The sample solution was titrated with a 0.5 mol/liter sulfuric acid solution (hereinafter also referred to as a titrant) employing phenolphthalein as an indicator. Thus, a blank sample solution was prepared in the same manner as above, except that the cellulose ester was not used, and titrated in the same manner as above. A supernatant of each solution after titration was diluted with water by a factor of 100, and composition of the organic acid of the resulting solution was measured according to ion chromatography. The degree DS of substitution of the cellulose ester was computed from the following equations.

$$TA = (B-A) \times F/(1000 \times W)$$

$$DSa = (162.14 \times TA)/\{1 - 42.14 \times TA + (1 - 56.06 \times TA) \times (X/AC)\}$$

$$DSx = Dsa \times (X/AC)$$

$$DS = Dsa + DSx$$

wherein A represents the amount of titrant added to the sample solution, B represents the amount of titrant added to the blank sample solution, F represents titer of the 0.5 mol/liter sulfuric acid solution, W represents weight (g) of cellulose ester, TA represents amount (mol/g) of total organic acids, amount titration amount of sample, the titration amount of sample, X/AC represents a ratio by mol of an acid (X) other than acetic acid to acetic acid (AC), measured according to ion chromatography, Dsa represents a degree of substitution of acetic acid, and DSx represents a degree of substitution of an acid other than acetic acid.

A degree of substitution of cellulose esters available on the market, used in examples, was determined according to the method above. The results are shown below.

The degree of substitution DS of Diacetylcellulose L50 (produced by Daicel Kagaku Co., Ltd.) was 2.33.

The degree of substitution DS of Triacetylcellulose L55 (produced by Daicel Kagaku Co., Ltd.) was 2.80.

Synthetic Example 1

Cellulose ester 1 was prepared according to the synthetic method disclosed in J. Appl. Polym. Sci., 58, 1263-1274 (1995).

Diacetylcellulose L50 (produced by Daicel Kagaku Kogyo Co., Ltd.) of 36.93 g were dissolved in 258.54 g of anhydrous tetrahydrofuran and 3.72 g (15 mmol) of 3-isocyanatopropyltrimethoxysilane (hereinafter also referred to as IPTS) was dropwise added to the resulting solution. Then, 0.29 g of dibutyltin dilaurate as a catalyst being further dropwise added, the resulting solution was refluxed while stirring for 5 hours.

Infrared absorption spectra of the resulting solution were measured and it was confirmed that absorption at 2271 cm$^{-1}$ resulting from the isocyanato group disappeared. Then, the solution was cooled, and poured in 3 liter of methanol to re-precipitate. Thus, 40.50 g of white solid was obtained. The $^{29}$Si-NMR spectra of the white solid exhibited a single absorption at −45.25 ppm. The $^{13}$C-NMR spectra of the white solid exhibited an absorption of amidocarbonyl at 163.07 ppm. Thus, it was confirmed that an intended cellulose ester 1 as intended was produced.

In the cellulose ester 1 obtained above, the degree of substitution of an acetyl group was 2.33, and the degree of substitution of triethoxysilylpropylamidocarbonyl was 0.10.

<Preparation of Transparent Resin Film Sample 101 (Inventive)>

Triacetylcellulose LT55 (produced by Daicel Kagaku Kogyo Co., Ltd.) of 10.0 g were dissolved in a mixture of 6.0 g of ethanol and 68.5 g of methylene chloride, and the resulting solution was cast over a glass plate employing a doctor blade with a gap width of 1000 µm to form a film, and the film was dried at 120° C. for 30 minutes. Thus, transparent resin film sample 101 with a thickness of 100 µm was obtained.

<Preparation of Transparent Resin Film Sample 102 (Inventive)>

Diiacetylcellulose L50 (produced by Daicel Kagaku Kogyo Co., Ltd.) of 10.0 g were dissolved in a mixture of 6.0 g of ethanol and 68.5 g of methylene chloride, and the resulting solution was cast over a glass plate employing a doctor blade with a gap width of 1000 µm to form a film, and the film was dried at 120° C. for 30 minutes. Thus, transparent resin film sample 102 with a thickness of 100 µm was obtained.

<Preparation of Transparent Resin Film Sample 103 (Inventive)>

Tetramethoxysilane of 3.04 g (20 mmol), 1.52 g of methylene chloride and 1.52 g of ethanol were mixed, and the resulting mixture was added with 0.72 g of a 0.5% aqueous nitric acid solution to carry out hydrolysis and stirred at room temperature for one hour.

Triacetylcellulose LT55 of 12.0 g were dissolved in a mixture of 6.2 g of ethanol and 60.9 g of methylene chloride, mixed with the above solution containing the hydrolyzation product of the tetramethoxysilane, and stirred for additional one hour. The resulting solution was cast over a glass plate employing a doctor blade with a gap width of 1000 μm to form a film, and the film was dried at 120° C. for 30 minutes. Thus, transparent resin film sample 103 with a thickness of 100 μm was obtained.

<Preparation of Transparent Resin Film Sample 104 (Inventive)>

Tetramethoxysilane of 3.04 g (20 mmol), 1.52 g of methyl acetate and 1.52 g of ethanol were mixed, and the resulting mixture was added with 0.72 g of a 0.5% aqueous nitric acid solution to carry out hydrolysis and stirred at room temperature for one hour.

Diacetylcellulose L50 of 12.0 g were dissolved in a mixture of 5.3 g of ethanol and 60.9 g of methyl acetate, mixed with the above solution containing the hydrolyzation product of the tetramethoxysilane, and stirred for additional one hour. The resulting-solution was cast over a glass plate employing a doctor blade with a gap width of 1000 μm to form a film, and the film was dried at 120° C. for 30 minutes. Thus, transparent resin film sample 104 with a thickness of 100 μm was obtained.

<Preparation of Transparent Resin Film Sample 105 (Inventive)>

Tetramethoxysilane of 6.03 g (40 mmol), 3.04 g of methyl acetate and 3.04 g of ethanol were mixed, and the resulting mixture was added with 1.44 g of a 0.5% aqueous nitric acid solution to carry out hydrolysis and stirred at room temperature for one hour.

Diacetylcellulose L50 of 12.0 g were dissolved in a mixture of 5.3 g of ethanol and 60.9 g of methyl acetate, mixed with the above solution containing the hydrolyzation product of the tetramethoxysilane, and stirred for additional one hour. The resulting solution was cast over a glass plate employing a doctor blade with a gap width of 1000 μm to form a film, and the film was dried at 120° C. for 30 minutes. Thus, transparent resin film sample 105 with a thickness of 100 μm was obtained.

<Preparation of Transparent Resin Film Sample 106 (Inventive)>

Methyltriethoxysilane of 3.19 g (18 mmol), 1.60 g of methyl acetate and 1.60 g of ethanol were mixed, and the resulting mixture was added with 0.49 g of a 0.5% aqueous nitric acid solution to carry out hydrolysis and stirred at room temperature for one hour.

Diacetylcellulose L50 of 12.0 g were dissolved in a mixture of 5.3 g of ethanol and 60.9 g of methyl acetate, mixed with the above solution containing the hydrolyzation product of the methyltriethoxysilane, and stirred for additional one hour. The resulting solution was cast over a glass plate employing a doctor blade with a gap width of 1000 μm to form a film, and the film was dried at 120° C. for 30 minutes. Thus, transparent resin film sample 106 with a thickness of 100 μm was obtained.

<Preparation of Transparent Resin Film Sample 107 (Inventive)>

Tetramethoxysilane of 3.04 g (20 mmol), 1.52 g of methyl acetate and 1.52 g of ethanol were mixed, and the resulting mixture was added with 0.72 g of a 0.5% aqueous nitric acid solution to carry out hydrolysis and stirred at room temperature for one hour.

Cellulose ester 1 above of 12.0 g were dissolved in a mixture of 5.3 g of ethanol and 60.9 g of methyl acetate, mixed with the above solution containing the hydrolyzation product of the tetramethoxysilane, and stirred for additional one hour. The resulting solution was cast over a glass plate employing a doctor blade with a gap width of 1000 μm to form a film, and the film was dried at 120° C. for 30 minutes. Thus, transparent resin film sample 107 with a thickness of 100 μm was obtained.

<Transparent Resin Film Sample 108 (Comparative)>

A 100 μm thick polyethersulfone film Sumilite FS-1300 produced by Sumitomo Bakelite Co., Ltd. was designated a transparent resin film sample 108 (comparative).

<Transparent Resin Film Sample 109 (Comparative)>

A 100 μm thick polycarbonate film Pure Ace produced by Teijin Co., Ltd. was designated a transparent resin film sample 109 (comparative).

<Transparent Resin Film Sample 110 (Comparative)>

A 100 μm thick polynorbornene film Arton produced by JSR Co., Ltd. was designated a transparent resin film sample 110 (comparative).

<Transparent Resin Film Sample 111 (Comparative)>

A film was prepared according to the procedure described in Example 1 disclosed in Japanese Patent O.P.I. Publication No. 2000-122038. A 10% polyvinyl pyrrolidone (PVP) ethanol solution, in which 10 g of PVP was dissolved in 90 g of ethanol, was prepared. A 40% tetraethoxysilane ethanol solution, in which 4.0 g of tetraethoxysilane was dissolved in 6.0 g of ethanol, was prepared. The polyvinyl pyrrolidone (PVP) ethanol solution was mixed with the 40% tetraethoxysilane ethanol solution, and 5.0 g of water, and 1.0 g of a 1.0 N hydrochloric acid solution were added thereto, and stirred for 24 hours. The resulting solution was cast on a glass plate, and dried to form a film with a dry thickness of 100 μm. The resulting film was peeled from the glass plate. Thus, transparent resin film sample 111 with a thickness of 100 μm was obtained.

<Transparent Resin Film Sample 112 (Comparative)>

A 100 μm thick polyethylene terephthalate (PET) film was designated a transparent resin film sample 112.

The inventive transparent resin film samples 101 through 107 and comparative transparent resin film samples 108 through 112 were evaluated according to the following methods.

<Measurement of Glass Transition Temperature (Tg) and Linear Expansion Coefficient>

Temperature at the inflexion point of the temperature-strain curve, obtained by thermal stress strain measurement (TMA), is defined as glass transition temperature.

A linear expansion coefficient was determined through a thermal stress strain measurement instrument TMA-SS6100 produced by Seiko-Instruments Inc. A 4 mm wide film sample with a thickness of 100 μm was fixed at a distance of 20 mm between the chucks, and heated from room temperature to 180° C. to remove a residual strain. Thereafter, the sample was heated at a rate of 10° C./minute from room temperature to 250° C., and the linear expansion coefficient thereof was determined from elongation of the distance between the chucks. Further, the glass transition temperature of the sample was determined from an inflexion point of a temperature-strain curve obtained as described above.

<Measurement of Birefringence and Wavelength Dispersion Property>

Refractive index in plane in an X direction and that in a Y direction in each sample were measured through an automatic birefringence meter KOBRA-21ADH, produced by Oji Keisoku Kiki Co., Ltd. Product of a thickness 100 μm (the film sample thickness) and a difference between the refractive index in plane in an X direction and that in a Y direction was defined as birefringence (nm).

Retardation at 480 nm $R_0$ (480) and retardation at 590 nm $R_0$ (590) were measured through KOBRA-210ADH. Ratio P represented by the following formula was computed as a measure of wavelength dispersion of the birefringence of the $$P=R_0(480)/R_0(590)$$

<Measurement of Light Transmittance>

Light transmittance was measured through TURBIDITY METER T-2600DA produces by Tokyo Denshoku Co., Ltd.

<Measurement of Ultraviolet Light Transmittance>

Ultraviolet light tranmittance was measured in a range of from 450 to 250 nm through a spectrophotometer U-3310, produced by Hitachi Seisakusho Co., Ltd., and the minimum ultraviolet light transmittance in the range was defined as ultraviolet light transmittance.

The results are shown in Table 1.

In contrast, transparent resin film sample 102 comprised of diacetylcellulose had a high glass transition temperature and a high UV light transmittance, which was satisfactory. Transparent resin film sample 101 comprised of triacetylcellulose, although its glass transition temperature was lower than that of sample 102, had a low linear expansion coefficient, a low birefringence in plane, and a positve wavelength dispersion, which was satisfactory.

Transparent resin film samples 103 through 106 comprised of cellulose ester and silica increase a glass transition temperature without greatly lowering UV light transmittance and without greatly increasing linear expansion coefficient, which were more satisfactory. Similarly, transparent resin film sample 107 comprised of cellulose ester 1 (diacetylcellulose modified with a silane coupling agent) and silica was also satisfactory.

Example 2

Employing transparent resin film samples 101 through 107 (inventive) above, and transparent resin film samples

TABLE 1

| Transparent resin film sample No. | Film composition | | Light transmittance (%) | UV light transmittance (%) | Birefringence (in plane) (nm) | Tg (° C.) | Linear expansion coefficient (ppm/° C.) | p | Remarks |
|---|---|---|---|---|---|---|---|---|---|
| | Polymer (content by weight) | Inorganic compound (content by weight) | | | | | | | |
| 101 | LT55(100%) | — | 93.3 | 78.9 | 0.2 | 198 | 55 | 0.98 | Inv. |
| 102 | L50(100%) | — | 93.3 | 78.9 | 1.3 | 201 | 66 | 0.97 | Inv. |
| 103 | LT55(91%) | SiO$_2$(9%) | 93.3 | 72.9 | 1.8 | 203 | 57 | 0.98 | Inv. |
| 104 | L50(91%) | SiO$_2$(9%) | 93.3 | 72.9 | 1.2 | 211 | 66 | 0.98 | Inv. |
| 105 | L50(83%) | SiO$_2$(17%) | 93.3 | 72.9 | 4.5 | 211 | 66 | 0.97 | Inv. |
| 106 | L50(91%) | MeSiO$_{1.5}$(9%) | 92.2 | 72.9 | 3.2 | 206 | 72 | 0.98 | Inv. |
| 107 | Cellulose ester 1 (91%) | SiO$_2$(9%) | 93.3 | 60.4 | 3.1 | 206 | 66 | 0.99 | Inv. |
| 108 | Sumilite FS1300 (100%) | — | 90.6 | 0.00 | 8.3 | 223 | 82 | 1.14 | Comp. |
| 109 | Pure Ace (100%) | — | 91.0 | 0.00 | 131 | 152 | 86 | 1.09 | Comp. |
| 110 | Arton (100%) | — | 92.2 | 17.3 | 8.0 | 171 | 102 | 1.01 | Comp. |
| 111 | PVP(46%) | Sio$_2$(54%) | 86.0 | 7.5 | 17.9 | 175 | 105 | 1.03 | Comp. |
| 112 | PEP(100%) | — | 90.4 | 0.00 | 5500 | 70 | 18 | 1.10 | Comp. |

Inv.; Inventive
Comp.; Comparative

Transparent resin film sample 108 had the highest glass transition temperature and a small birefringence in plane, but had a low UV light transmittance and a negative wavelength dispersion, which was unsatisfactory. Transparent resin film sample 109 had a low glass transition temperature, a low UV light transmittance, a great birefringence in plane, and a negative wavelength dispersion, which was unsatisfactory. Transparent resin film sample 110 had a relatively high glass transition temperature and a small birefringence in plane, but had a relatively low UV light transmittance due to absorption near 270 nm and a great linear expansion coefficient, which was unsatisfactory. Transparent resin film sample 111 had a great linear expansion coefficient, and was brittle and likely to be broken, which was unsatisfactory. Transparent resin film sample 112 had a low glass transition temperature, which was unsatisfactory.

108 through 112 (comparative) above, curability test of UV curable resin and UV resistance test were carried out.

<Curability Test of UV Curable Resin>

A UV curable resin as an adhesive was coated on the transparent resin film sample to give a thickness of 100 μm, and the same sample was laminated on the resulting UV curable resin layer. The resulting laminated material was subjected to UV exposure through the transparent film to cure the adhesive, employing a UV handy lamp, and curability of the adhesive was tested.

A sealing agent for FPD, produced by Three Bond Co., Ltd., was used as the UV curable resin, and the UV exposure was carried out at an intensity of 45 mW/cm$^2$ for 5 seconds and for 20 seconds. Evaluation was carried out according to the following criteria:

A: The sealing agent was cured, and the two samples adhered each other.
B: The sealing agent was not cured, and the two samples did not adhere each other.

The results are shown in Table 2.

<UV Resistance Test>

Each sample was subjected to UV exposure at an intensity of 45 mW/cm$^2$ for 20 seconds, employing the UV handy lamp, and the exposed sample was folded. Evaluation was carried out according to the following criteria:
A: The exposed sample, when folded, was not broken.
B: The exposed sample, when folded, was broken.

The results are shown in Table 2.

TABLE 2

| Transparent resin film sample No. | Curability test of UV curable resin | | UV resistance test | Remarks |
|---|---|---|---|---|
| | 5 second exposure | 20 second exposure | | |
| 101 | A | A | A | Inventive |
| 102 | A | A | A | Inventive |
| 103 | A | A | A | Inventive |
| 104 | A | A | A | Inventive |
| 105 | A | A | A | Inventive |
| 106 | A | A | A | Inventive |
| 107 | A | A | A | Inventive |
| 108 | B | A | A | Comparative |
| 109 | B | A | A | Comparative |
| 110 | A | A | B | Comparative |
| 111 | A | A | B | Comparative |
| 112 | B | A | A | Comparative |

As is apparent from Table 2, 20 second UV exposure cured the UV curable resin used in all the samples, however, 5 second UV exposure did not cure the UV curable resin in samples 108 and 109 each having a UV light transmittance of 0%, and in sample 112. Sample 110 (comparative), although it had UV absorption, cured the resin in a UV exposure time of 5 seconds, was made brittle by UV exposure and likely to be broken, which was unsatisfactory. Sample 111 (comparative), although it cured the resin in a UV exposure time of 5 seconds, was made brittle by UV exposure and likely to be broken, which was unsatisfactory. In contrast, samples 101 through 107 cured the resin in a short UV exposure time of 5 seconds, and were not made brittle by UV exposure, which were satisfactory.

Example 3

A moisture-proof layer was formed on the transparent resin film sample Nos. 101 through 111 obtained above. Thus, transparent resin film samples 201 through 211, having a moisture-proof layer, were prepared from the transparent resin film samples 101 through 111, respectively.

<Formation of Moisture-Proof Layer>

A planar plasma discharge treatment apparatus was used in which two kinds of flat electrodes were opposed in parallel with each other. A transparent resin film sample being placed in a space between the opposed electrodes, a mixed gas was introduced to the space to form a moisture-proof layer on the surface of the transparent resin film sample.

The electrodes as described below were used.

A stainless steel plate having a size of 200 mm×200 mm×2 mm was coated with an alumina thermal spray layer with high density and high adhesion to obtain an electrode, and then a solution prepared by diluting tetramethoxysilane with ethyl acetate was coated on the resulting electrode, dried and hardened by UV ray irradiation to carry out sealing treatment. Thus, a dielectric layer coated electrode was obtained. The dielectric layer surface of the electrode was polished, smoothed, and processed to give an Rmax of 5 µm. The resulting electrode was grounded.

The same dielectric layer as above was coated on hollow, prismatic pure titanium pipes under the same condition as above. Thus, plural electrodes were prepared as a group of voltage application electrodes, and were provided opposed to the electrode obtained above.

As a power supply for generating plasma, a high frequency power supply JRF-10000 (13.56 MHz) produced by Nihon Denshi Co. Ltd. was used, and power of 5 W/cm$^2$ was supplied at a frequency of 13.56 MHz. A reaction gas having the composition as shown below was supplied to the gap between the opposed electrodes. Temperature of the film sample was 135° C. during treatment.

| Inert gas: argon | 99.2% by volume |
|---|---|
| Reactive gas 1: hydrogen | 0.5% by volume |
| Reactive gas 2: tetraethoxysilane | 0.3% by volume |

The transparent resin film sample 101 prepared above was subjected to atmospheric pressure plasma treatment under the above conditions employing the above reaction gas to form a silicon oxide layer as a moisture-proof layer. Thus, a transparent resin film sample 201 was prepared. The sample was prepared to give the silicon oxide layer thickness of 100 nm, based on a calibration curve of layer thickness vs. plasma treatment time, prepared in advance. The layer thickness was measured through FE-3000 produced by Otsuka electronics Co., Ltd.

Transparent resin film samples 202 through 210 were prepared from transparent resin film sample 102 through 110, respectively, in the same manner as transparent resin film sample 201. Transparent resin film sample 111 was very brittle, and the silicon oxide layer was not formed. Transparent resin film sample 112 had a too low glass transition temperature, and the silicon oxide layer was not formed also. The resulting samples were evaluated according to the following method.

<Moisture Vapor Permeability>

Moisture vapor permeability of the sample was measured through Model 7000 produced by Illinois Instrument Co., Ltd. After the sample was subjected to a temperature cycle test in which a procedure, in which the sample was maintained at 180° C. for one hour, and allowed to stand to cool for one hour, was repeated ten times. Moisture vapor permeability of the sample before the temperature cycle test and that after the temperature cycle test was determined.

<Cross-Cut Adhesion Test>

A cross-cut adhesion test as described in JIS K5400 was carried out. Eleven lines were cut at an interval of 1 mm in the transverse and longitudinal directions on the layer surface with a single-edged blade normal to the layer surface to form one hundred 1 mm square grids. Then, cellophane adhesive tape available on the market was applied to the grid surface, and the tape, with one edge unattached, was sharply peeled away from the surface at an angle of 90°. The rate of the area of the peeled layer to the area of the adhered tape was calculated, and evaluation was carried out according to the following criteria.

A: No peeled layer was observed.

B: The rate of the area of the peeled layer to the area of the adhered tape was less than 10%.

C: The rate of the area of the peeled layer to the area of the adhered tape was not less than 10%.

The results are shown in Table 3.

TABLE 3

| Transparent resin film sample No. | Moisture vapor permeability (g/m²/d) | | Cross-cut adhesion test | Remarks |
|---|---|---|---|---|
| | Before temperature cycle test | After temperature cycle test | | |
| 201 | 0.95 | 1.41 | A | Inventive |
| 202 | 0.91 | 1.58 | A | Inventive |
| 203 | 0.85 | 1.37 | A | Inventive |
| 204 | 0.97 | 1.88 | A | Inventive |
| 205 | 0.89 | 1.76 | A | Inventive |
| 206 | 0.73 | 1.45 | A | Inventive |
| 207 | 0.93 | 1.52 | A | Inventive |
| 208 | 0.78 | 3.43 | B | Comparative |
| 209 | 2.94 | 7.90 | B | Comparative |
| 210 | 0.74 | 10.9 | C | Comparative |

Generally, cellulose ester films have problem in that they have great moisture vapor permeability (for example, 800 to 1000 g/m²/d). However, as is apparent from Table 3 above, the samples having a silicon oxide layer formed according to the atmospheric pressure plasma treatment provide a high moisture-proof property. The samples 209, 210 and 211, which are low in heat resistance, exhibited an insufficient gas barrier property. This is probably because the transparent films used in these samples softened at high temperature during the layer formation, and therefore, the uniform silicon oxide layer was not formed. Transparent film samples 208 through 212, employing samples 108 through 112 having high linear expansion coefficient, greatly deteriorated moisture vapor permeability after the temperature cycle test, and exhibited an insufficient gas barrier property and an insufficient adhesion. Transparent film sample 212 exhibited a high gas barrier property before the temperature cycle test, but greatly deteriorated a gas barrier property after the temperature cycle test, and exhibited an insufficient adhesion. This is probably because the vacuum deposition method does not form a chemical bond between the triacetylcellulose film surface and the silicon oxide layer vapor, and as the silicon oxide layer contains few impurities and has a low linear expansion coefficient, the difference in linear expansion coefficient between the triacetylcellulose film and the silicon oxide layer vapor is great.

Example 4

A transparent conductive layer was formed on the silicon oxide layer of the transparent resin film sample Nos. 201 through 210 obtained above according to the following methods. Thus, transparent conductive film samples 301 through 310, having a transparent conductive layer, were prepared from the transparent resin film samples 201 through 210, respectively.

<Formation of Transparent Conductive Layer>

A transparent conductive layer was formed on the silicon oxide layer in the same manner as the a moisture-proof layer above, except that power of 10 W/cm² was supplied and a reaction gas used was changed to that described below.

| | |
|---|---|
| Inert gas: helium | 98.7% by volume |
| Reactive gas 1: hydrogen | 0.05% by volume |
| Reactive gas 2: indium acetylacetonate | 1.2% by volume |
| Reactive gas 3: dibutyltin diacetate | 0.05% by volume |

The transparent film 201 above was subjected to atmospheric pressure plasma treatment under the above conditions employing the above gas to form a tin doped indium oxide layer (ITO layer) on the silicon oxide layer. Thus, transparent conductive film sample 301 was prepared.

Transparent conductive film samples 302 through 310 were prepared from transparent resin film sample 202 through 210, respectively, in the same manner as transparent conductive film sample 301. The resulting samples were evaluated according to the following method.

<Resistivity>

Resistivity was measured according to JIS-R-1637, employing a four terminal method. The measurement was carried out employing Loresta GP, MCP-T600 produced by Mitsubishi Chemical Corporation.

<Measurement of Transmittance>

Transmittance was measured through TURBIDITY METER T-2600DA produced by Tokyo Denshoku Co., Ltd.

<Measurement of Variation of Average Reflectance>

Reflectance of each sample was measured in the range of from 400 to 700 nm under condition of a 5° regular reflection, employing a spectrophotometer TYPE U-4000 (produced by Hitachi Seisakusho Co., Ltd.), and the average reflectance was determined from the measurements. In the above measurement, in order to prevent light reflection from a rear surface of the sample opposite the transparent conductive layer, the rear surface was surface-roughened, and subjected to light absorbing treatment employing with black spray to form a light absorbing layer. The average reflectance of ten of each sample was determined and the difference between the maximum average reflectance and the minimum average reflectance was represented as a measure of the variation of average reflectance.

Transparent conductive film samples 301 through 310 with a transparent conductive layer were evaluated for resistivity, transmittance and variation of average reflectance of each sample. The results are shown in Table 4.

TABLE 4

| Transparent conductive film sample No. | Resistivity (× 10⁻⁴ Ωcm) | Transmittance (%) | Variation of average reflectance (%) | Remarks |
|---|---|---|---|---|
| 301 | 2.5 | 88 | 0.1> | Invention |
| 302 | 2.4 | 88 | 0.1> | Invention |
| 303 | 1.9 | 88 | 0.1> | Invention |
| 304 | 1.7 | 88 | 0.1> | Invention |
| 305 | 1.7 | 88 | 0.1> | Invention |
| 306 | 2.2 | 88 | 0.1> | Invention |
| 307 | 2. | 88 | 0.1> | Invention |
| 308 | 1.9 | 88 | 0.2 | Comparative |
| 309 | 2.6 | 87 | 0.9 | Comparative |
| 310 | 2.3 | 87 | 0.6 | Comparative |

As is apparent from Table 4 above, sample Nos. 301 through 307 (Inventive), and sample Nos. 308 through 310 (Comparative) provided good transparent conductive films with high transparency and low resistivity. However, comparative sample Nos. 308 through 310 exhibited high variation of reflectance, but in contrast, inventive sample Nos. 301 through 307 provided good transparent conductive films with extremely low variation of reflectance. This phenomenon is considered to occur because a substrate with low heat resistance is not resistant to a high electric power or high temperature during the transparent conductive layer formation or because the ITO layer produced minute cracks during cooling due to the difference in linear expansion coefficient between the ITO layer and the transparent film sample.

Example 5

Figure 5:
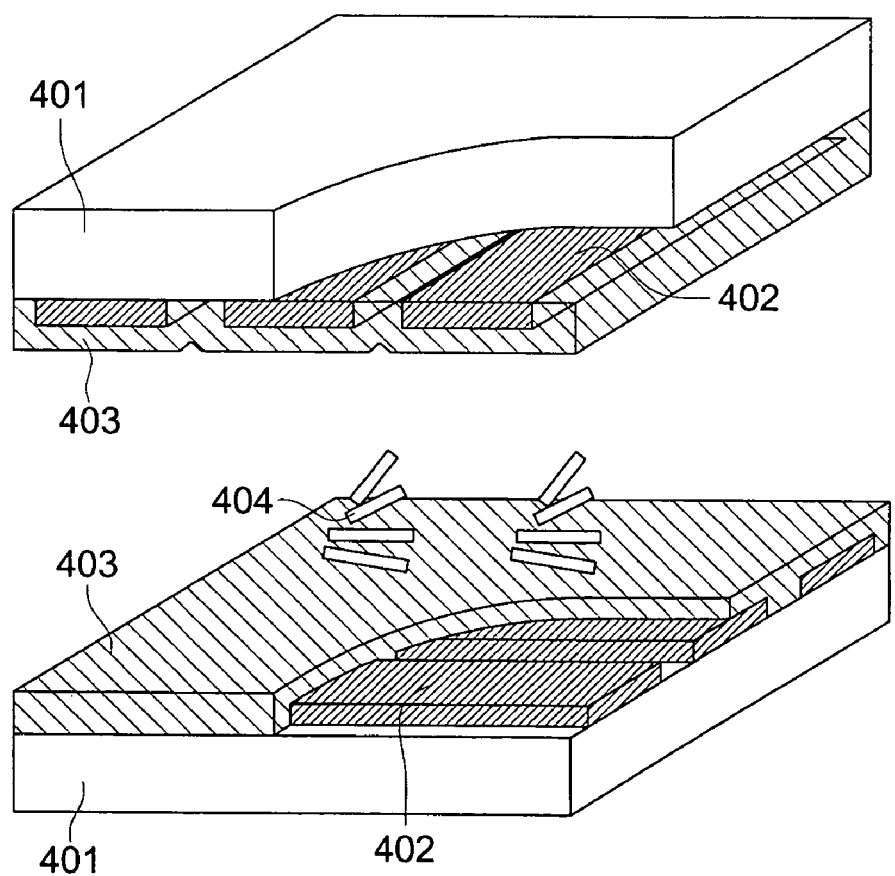
FIG. 5 is a perspective view of a liquid crystal display.

A TN liquid crystal display element as shown in FIG. 5 was prepared according to the following method, employing inventive transparent conductive film samples 301 through 307, and comparative transparent conductive film samples 308 through 310.

<Preparation of TN Liquid Crystal Display Element>

The transparent conductive film sample obtained above was used as a transparent conductive substrate 401. A resin layer (not illustrated) for surface smoothing was coated on the substrate 401, and a transparent conductive layer in the form of stripe was provided directly or another layer such as a silicon oxide layer on the resin layer to form an electrode 402 for displaying. Thus, a plate for forming a cell was prepared. Another plate was prepared in the same way as above, and an orientation layer 403 was provided thereon. After an ultraviolet ray curable resin XNR 5516 (produced by NAGASE & Co., Ltd.) and a spacer were provided at the marginal part of the plate according to a printing method to form a sealing layer (not illustrated), one plate was superposed on the other so that the two electrodes were opposed, and the resulting superposed plate was exposed to ultraviolet rays at an energy of 6000 mJ, employing a metal halide lamp for ultraviolet light curing (produced by Ushio Electric Co., Ltd.) from one side of the superposed plate. Thereafter, the exposed plate was further heated at 150° C. for one hour to cure the sealing layer. Thus, a vacant cell was obtained.

The same procedure as above was carried out employing the transparent conductive film samples 301 through 307, as the transparent conductive substrate 401, the two plates were adhered to each other with a sealing agent of UV curable resin, and could form a cell. On the other hand, the same procedure as above was carried out employing the transparent conductive film samples 308 through 310, as the transparent conductive substrate 401. However, as the two plates were not adhered to each other, and could not form a cell, the superposed plate was exposed to ultraviolet rays 4 times the above exposure energy. As a result, in sample 309, great deformation occurred and the two substrates were not adhered to each other, and in sample 308, slight coloration was observed after adhesion of the two substrates.

Subsequently, liquid crystal was injected into the cell under vacuum, and terminals were attached to the opposed electrodes so that driving voltage could be applied. The resulting liquid crystal cell was combined with an optical retardation plate, a polarizing plate, a touch panel, or a light source to prepare a liquid crystal display.

Thus, a liquid crystal display was prepared employing the transparent conductive film samples 301 through 310, as the transparent conductive substrate. A liquid crystal display prepared employing the transparent conductive film samples 301 through 307 provided a good image. When transparent conductive film sample 308 was used, the two substrates were separated during injection of liquid crystal, and a liquid crystal display could not be prepared. A liquid crystal display prepared employing the transparent conductive film sample 309 or 310 provided a distorted image and poor color reproduction.

Example 6

Figure 6:
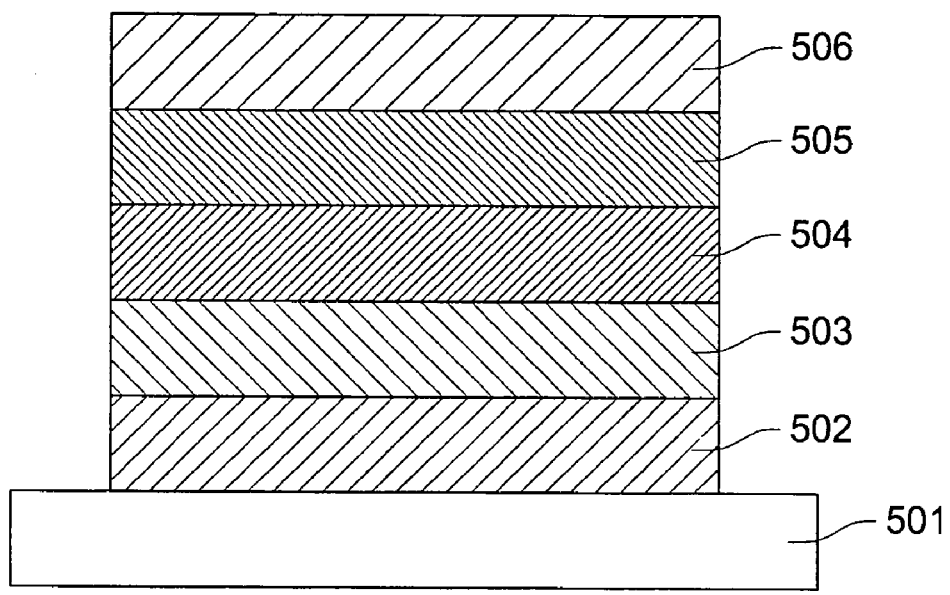
FIG. 6 is a schematic diagram of one embodiment of an organic EL element.

A simple matrix drive organic EL element as shown in FIG. 6 was prepared according to the following method, employing, as a transparent conductive substrate, each of inventive transparent conductive film samples 301 through 307, and comparative transparent conductive film samples 308 through 310.

<Preparation of Organic EL Element>

A transparent conductive layer (anode) 502 was formed on a transparent conductive substrate 501. The resulting material was ultrasonic-washed employing a neutral detergent, acetone, and ethanol, washed in a boiling ethanol, and dried. Subsequently, the transparent conductive layer surface was washed with $UV/O_3$, and then, N,N'-diphenyl-diphenyl-m-tolyl-4,4'-diamine-1,1'-biphenyl (TPD) was deposited on the washed transparent conductive layer at a deposition speed of 0.2 nm/sec in a vacuum deposition apparatus to form a hole injecting layer 503 with a thickness of 55 nm, and tris(8-quinolato)aluminum (Alq3) on the hole injecting layer at a deposition speed of 0.2 nm/sec to form an electron injecting, electron transporting and emission layer 504 with a thickness of 50 nm.

Subsequently, a cathode 505 with a thickness of 200 nm was provided on the electron injecting, electron transporting and emission layer as a target Al—Sm alloy (Sm: 10 at %) in a sputtering apparatus according to a DC sputtering method. In the above process, gas used for sputtering was argon, the gas pressure was 3.5 Pa, and the distance between the target and the material to be sputtered was 9.0 cm. The electric power applied was 1.2 $W/cm^2$.

A layer 506 of $SiO_2$ with a thickness of 200 nm was provided on the cathode as a protective layer according to a sputtering method. Thus, an organic EL element was obtained. This organic EL element comprised two stripe cathodes parallel with each other, and eight stripe anodes parallel with one another, the anodes being perpendicular to the cathodes, which had 16 pixels with a size of 2 mm×2 mm each pixel being arranged at an interval of 2 mm.

The thus obtained organic EL element was driven applying 9 V. Organic EL elements employing inventive transparent conductive film samples 301 through 307 provided a luminance of not less than 350 $cd/m^2$. In contrast, organic EL elements employing comparative transparent conductive film samples 308 through 310 provided a luminance of not more than 50 $cd/m^2$, which was not a luminance enough to use as an organic EL element.

A base plate with a spacer was provided on the organic EL element obtained above so as to surround the organic EL element, (where a UV curable adhesive LUXTRAK LC0269 produced by Toagosei Co., Ltd was placed in the space formed by the spacer), and was brought into contact with the element. The resulting material was exposed to UV light through the transparent conductive film sample, employing the metal halide lamp used in Example 4 to cure the adhesive and seal the organic EL element. Employing each of inventive transparent conductive film samples 301 through 307, and comparative transparent conductive film samples 308 through 310 as the transparent conductive substrate 501 of the organic EL element, the above sealing was carried out. UV irradiation was carried out at an energy of 6000 mJ.

The inventive transparent conductive film samples 301 through 307 could seal the organic EL element with sufficient strength due to photocuring, but the comparative transparent conductive film samples 308 through 310 could not sufficiently seal the organic EL element due to insufficient photocuring.

Example 7

Figure 7:
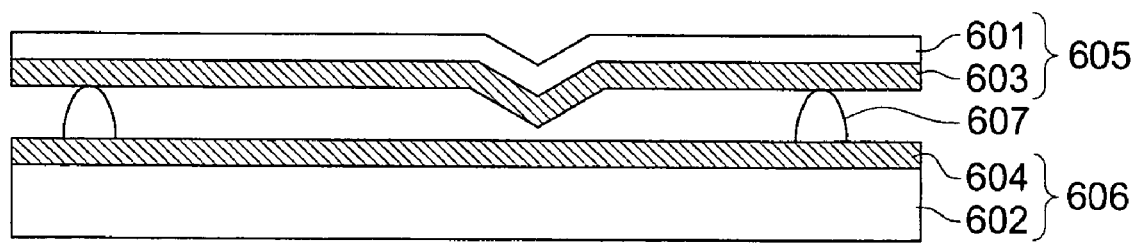
FIG. 7 is a sectional view of one embodiment of a touch panel.

A touch panel as shown in FIG. 7 was prepared according to the following method, employing inventive transparent conductive film samples 301 through 307, and comparative transparent conductive film samples 308 through 310.

<Preparation of Touch Panel>

In FIG. 7, a lower electrode 606 is comprised of a glass plate 602 for a touch panel and an ITO transparent conductive layer 604 (formed according to a sputtering method), and an upper electrode 605 is comprised of the transparent conductive film obtained above (i.e., inventive transparent conductive film samples 301 through 307, and comparative transparent conductive film samples 308 through 310) comprising a transparent film 601 and a transparent conductive layer 603. As shown in FIG. 7, a heat curable dot spacer 607 is provided on the transparent conductive layer, the upper electrode and the lower electrode are adhered so that both transparent conductive layers face each other, forming an interval of 7 μm between both transparent conductive layers. Thus, a touch panel was prepared.

After an image was placed under the touch panel obtained above, the image was obliquely observed at an angle of 45° from the touch panel side, and a visibility test was carried out as to whether the image was observed without distortion. As a result, the touch panel employing inventive transparent conductive film samples 301 through 307 provided an image without distortion, however, the touch panel employing inventive transparent conductive film samples 308 through 310 provided an image with distortion.

EFFECTS OF THE INVENTION

The present invention can provide a transparent film with high UV light transmittance, or a transparent film comprised of a noble organic-inorganic hybrid polymer, which is suitable for a film for sealing or a substrate of an electronic display.

What is claimed is:

1. A method of manufacturing a transparent resin film, the method comprising the steps of:
dissolving an alkoxysilane in a first solvent containing a alcohol having 1 to 4 carbon atoms to obtain an alkoxysilane polycondensation product solution;
dissolving cellulose ester in a second mixture solvent of methylene chloride and ethyl alcohol having a methylene chloride to ethyl alcohol ratio of from 95:5 to 80:20 to obtain a cellulose ester solution;
mixing the alkoxysilane polycondensation product solution and the cellulose ester solution to provide a cellulose ester dope containing the alcohol in an amount of 1 to 40% by weight; and
casting the resulting cellulose ester dope on a support to form the transparent resin film, wherein the alkoxysilane is represented by the following formula 1:

$$(R_{4-n})Si(OR')_n \qquad \text{Formula 1}$$

wherein R and R' independently represent a hydrogen atom or a substituent; and n represents an interger of 3 or 4, and wherein the transparent resin film has an ultraviolet light transmittance of not less than 50%, the ultaviolet light having a wavelength range of from 250 to 450 nm, and has a glass transition temperature of not less than 180° C., the glass transition temperature being measured according to thermal stress strain measurement (TMA).

2. The method of claim 1, wherein a degree of substitution of the cellulose ester satisfies the following mathematical expressions 1 and 2:

$$0 \leq Y \leq 1.5, \qquad \text{Expression 1:}$$

$$1.0 < X+Y \leq 2.9, \qquad \text{Expression 2:}$$

wherein X repersents a degree of substituion of an acetyl group and Y represents a degree of substituion of a substituent having an alkoxysilyl group.

3. The method of claim 1, wherein the content of the polycondensation product is less than 20% by weight based on the transparent film and wherein the polycondensation product is represented by the following formula 2:

$$(R_{4-n})SiO_{n/2}, \qquad \text{Formula 2}$$

wherein R represents a hydrogen atom or a substituent; and n represents an integer of 3 or 4.

4. The method of claim 1, wherein the transparent film contains a plasticizer in an amount less than 1% by weight.

5. The method of claim 1, wherein the ratio $R_0$ (480)/R (580) obtained by dividing retardation in plane $R_0$ (480) of the film at a wavelength 480 nm by retardation in plane R (590) of the film at a wavelength 590 nm is from 0.8 to less than 1.0.

6. The method of claim 1, wherein the transparent film contains the cellulose ester in an amount of not less than 80% by weight and the alkoxysilane polycondensation product in an amount of 1 to less than 20% by weight in terms of silicon dioxide.

7. The method of claim 1, wherein the first solvent contains methylene chloride.

8. The method of claim 1, wherein the first solvent contains methyl acetate.

* * * * *